(12) United States Patent
Zheng et al.

(10) Patent No.: US 8,384,192 B2
(45) Date of Patent: Feb. 26, 2013

(54) METHODS FOR FORMING SMALL-SCALE CAPACITOR STRUCTURES

(75) Inventors: Lingyi A. Zheng, Manassas, VA (US); Trung T. Doan, Vallejo, CA (US); Lyle D. Breiner, Meridian, ID (US); Er-Xuan Ping, Meridian, ID (US); Kevin L. Beaman, Boise, ID (US); Ronald A. Weimer, Boise, ID (US); Cem Basceri, Cary, NC (US); David J. Kubista, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/047,430

(22) Filed: Mar. 14, 2011

(65) Prior Publication Data

US 2011/0163416 A1 Jul. 7, 2011

Related U.S. Application Data

(62) Division of application No. 10/767,298, filed on Jan. 28, 2004, now Pat. No. 7,906,393.

(51) Int. Cl.
*H01L 21/02* (2006.01)

(52) U.S. Cl. .................. 257/534; 257/301; 257/E29.342

(58) Field of Classification Search .................... 257/68, 257/71, 296, 301–303, 532, 534, E29.342
See application file for complete search history.

(56) References Cited

U.S. PATENT DOCUMENTS

| | | | |
|---|---|---|---|
| 579,269 A | 3/1897 | Hent | |
| 3,618,919 A | 11/1971 | Beck | |
| 3,620,934 A | 11/1971 | Endle | |
| 3,630,769 A | 12/1971 | Hart et al. | |
| 3,630,881 A | 12/1971 | Lester | |
| 3,634,212 A | 1/1972 | Valayll et al. | |
| 4,018,949 A | 4/1977 | Donakowski et al. | |
| 4,242,182 A | 12/1980 | Popescu et al. | |
| 4,269,625 A | 5/1981 | Molenaar et al. | |
| 4,289,061 A | 9/1981 | Emmett | |
| 4,397,753 A | 8/1983 | Czaja | |

(Continued)

FOREIGN PATENT DOCUMENTS

| | | |
|---|---|---|
| DE | 198 51 824 A1 | 5/2000 |
| EP | 1 167 569 A1 | 1/2002 |

(Continued)

OTHER PUBLICATIONS

Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.

(Continued)

*Primary Examiner* — Tucker Wright
(74) *Attorney, Agent, or Firm* — Perkins Coie LLP

(57) ABSTRACT

The present disclosure provides small scale capacitors (e.g., DRAM capacitors) and methods of forming such capacitors. One exemplary implementation provides a method of fabricating a capacitor that includes sequentially forming a first electrode, a dielectric layer, and a second electrode. At least one of the electrodes may be formed by a) reacting two precursors to deposit a first conductive layer at a first deposition rate, and b) depositing a second conductive layer at a second, lower deposition rate by depositing a precursor layer of one precursor at least one monolayer thick and exposing that precursor layer to another precursor to form a nanolayer reaction product. The second conductive layer may be in contact with the dielectric layer and have a thickness of no greater than about 50 Å.

22 Claims, 12 Drawing Sheets

U.S. PATENT DOCUMENTS

| | | |
|---|---|---|
| 4,438,724 A | 3/1984 | Doehler et al. |
| 4,469,801 A | 9/1984 | Hirai et al. |
| 4,545,136 A | 10/1985 | Izu et al. |
| 4,590,042 A | 5/1986 | Drage |
| 4,681,777 A | 7/1987 | Engelken et al. |
| 4,826,579 A | 5/1989 | Westfall |
| 4,948,979 A | 8/1990 | Munakata et al. |
| 4,949,669 A | 8/1990 | Ishii et al. |
| 4,966,646 A | 10/1990 | Zdeblick |
| 4,977,106 A | 12/1990 | Smith |
| 5,076,205 A | 12/1991 | Vowles et al. |
| 5,091,207 A | 2/1992 | Tanaka et al. |
| 5,131,752 A | 7/1992 | Yu et al. |
| 5,136,975 A | 8/1992 | Bartholomew et al. |
| 5,172,849 A | 12/1992 | Barten et al. |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,364,219 A | 11/1994 | Takahashi et al. |
| 5,377,429 A | 1/1995 | Sandhu et al. |
| 5,380,396 A | 1/1995 | Shikida et al. |
| 5,409,129 A | 4/1995 | Tsukada et al. |
| 5,418,180 A | 5/1995 | Brown |
| 5,427,666 A | 6/1995 | Mueller et al. |
| 5,433,835 A | 7/1995 | Demaray et al. |
| 5,445,491 A | 8/1995 | Nakagawa et al. |
| 5,480,818 A | 1/1996 | Matsumoto et al. |
| 5,498,292 A | 3/1996 | Ozaki |
| 5,500,256 A | 3/1996 | Watabe et al. |
| 5,522,934 A | 6/1996 | Suzuki et al. |
| 5,536,317 A | 7/1996 | Crain et al. |
| 5,562,800 A | 10/1996 | Kawamura et al. |
| 5,589,002 A | 12/1996 | Su |
| 5,592,581 A | 1/1997 | Okase et al. |
| 5,595,606 A | 1/1997 | Fujikawa et al. |
| 5,599,513 A | 2/1997 | Masaki et al. |
| 5,624,498 A | 4/1997 | Lee et al. |
| 5,626,936 A | 5/1997 | Alderman |
| 5,640,751 A | 6/1997 | Faria |
| 5,643,394 A | 7/1997 | Maydan et al. |
| 5,654,589 A | 8/1997 | Huang et al. |
| 5,693,288 A | 12/1997 | Nakamura et al. |
| 5,729,896 A | 3/1998 | Dalal et al. |
| 5,746,434 A | 5/1998 | Boyd et al. |
| 5,766,364 A | 6/1998 | Ishida et al. |
| 5,769,952 A | 6/1998 | Komino et al. |
| 5,788,778 A | 8/1998 | Shang et al. |
| 5,792,269 A | 8/1998 | Deacon et al. |
| 5,792,700 A | 8/1998 | Turner et al. |
| 5,820,641 A | 10/1998 | Gu et al. |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,849 A | 12/1998 | Comizzoli et al. |
| 5,865,417 A | 2/1999 | Harris et al. |
| 5,879,459 A | 3/1999 | Gadgil et al. |
| 5,895,530 A | 4/1999 | Shrotriya et al. |
| 5,908,947 A | 6/1999 | Vaartstra |
| 5,932,286 A | 8/1999 | Beinglass et al. |
| 5,953,634 A | 9/1999 | Kajita et al. |
| 5,956,613 A | 9/1999 | Zhao et al. |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 6,008,086 A | 12/1999 | Schuegraf et al. |
| 6,032,923 A | 3/2000 | Biegelsen et al. |
| 6,042,652 A | 3/2000 | Hyun et al. |
| 6,045,620 A | 4/2000 | Tepman et al. |
| 6,059,885 A | 5/2000 | Ohashi et al. |
| 6,062,256 A | 5/2000 | Miller et al. |
| 6,070,551 A | 6/2000 | Li et al. |
| 6,079,426 A | 6/2000 | Subrahmanyam et al. |
| 6,080,446 A | 6/2000 | Tobe et al. |
| 6,086,677 A | 7/2000 | Umotoy et al. |
| 6,089,543 A | 7/2000 | Freerks |
| 6,109,206 A | 8/2000 | Maydan et al. |
| 6,123,107 A | 9/2000 | Selser et al. |
| 6,129,331 A | 10/2000 | Henning et al. |
| 6,139,700 A | 10/2000 | Kang et al. |
| 6,143,077 A | 11/2000 | Ikeda et al. |
| 6,143,078 A | 11/2000 | Ishikawa et al. |
| 6,143,659 A | 11/2000 | Leem et al. |
| 6,144,060 A | 11/2000 | Park et al. |
| 6,149,123 A | 11/2000 | Harris et al. |
| 6,160,243 A | 12/2000 | Cozad |
| 6,161,500 A | 12/2000 | Kopacz et al. |
| 6,173,673 B1 | 1/2001 | Golovato et al. |
| 6,174,366 B1 | 1/2001 | Ihantola et al. |
| 6,174,377 B1 | 1/2001 | Doering et al. |
| 6,174,809 B1 | 1/2001 | Kang et al. |
| 6,178,660 B1 | 1/2001 | Emmi et al. |
| 6,182,603 B1 | 2/2001 | Shang et al. |
| 6,192,827 B1 | 2/2001 | Welch et al. |
| 6,193,802 B1 | 2/2001 | Pang et al. |
| 6,194,628 B1 | 2/2001 | Pang et al. |
| 6,197,119 B1 | 3/2001 | Dozoretz et al. |
| 6,200,415 B1 | 3/2001 | Maraschin |
| 6,203,613 B1 | 3/2001 | Gates et al. |
| 6,206,972 B1 | 3/2001 | Dunham |
| 6,210,754 B1 | 4/2001 | Lu et al. |
| 6,211,033 B1 | 4/2001 | Sandhu et al. |
| 6,211,078 B1 | 4/2001 | Mathews |
| 6,214,714 B1 | 4/2001 | Wang et al. |
| 6,218,256 B1 | 4/2001 | Agarwal |
| 6,237,394 B1 | 5/2001 | Harris et al. |
| 6,237,529 B1 | 5/2001 | Spahn |
| 6,245,192 B1 | 6/2001 | Dhindsa et al. |
| 6,255,222 B1 | 7/2001 | Xia et al. |
| 6,263,829 B1 | 7/2001 | Schneider et al. |
| 6,270,572 B1 | 8/2001 | Kim et al. |
| 6,280,584 B1 | 8/2001 | Kumar et al. |
| 6,287,965 B1 | 9/2001 | Kang et al. |
| 6,287,980 B1 | 9/2001 | Hanazaki et al. |
| 6,290,491 B1 | 9/2001 | Shahvandi et al. |
| 6,291,337 B1 | 9/2001 | Sidhwa |
| 6,297,539 B1 | 10/2001 | Ma et al. |
| 6,302,964 B1 | 10/2001 | Umotoy et al. |
| 6,302,965 B1 | 10/2001 | Umotoy et al. |
| 6,303,953 B1 | 10/2001 | Doan et al. |
| 6,305,314 B1 | 10/2001 | Sneh et al. |
| 6,309,161 B1 | 10/2001 | Hofmeister |
| 6,315,859 B1 | 11/2001 | Donohoe |
| 6,321,680 B2 | 11/2001 | Cook et al. |
| 6,329,297 B1 | 12/2001 | Balish et al. |
| 6,342,277 B1 | 1/2002 | Sherman |
| 6,346,477 B1 | 2/2002 | Kaloyeros et al. |
| 6,347,602 B2 | 2/2002 | Goto et al. |
| 6,347,918 B1 | 2/2002 | Blahnik |
| 6,355,561 B1 | 3/2002 | Sandhu et al. |
| 6,358,323 B1 | 3/2002 | Schmitt et al. |
| 6,374,831 B1 | 4/2002 | Chandran et al. |
| 6,387,185 B2 | 5/2002 | Doering et al. |
| 6,387,207 B1 | 5/2002 | Janakiraman et al. |
| 6,419,462 B1 | 7/2002 | Horie et al. |
| 6,420,230 B1 | 7/2002 | Derderian et al. |
| 6,420,742 B1 | 7/2002 | Ahn et al. |
| 6,428,859 B1 | 8/2002 | Chiang et al. |
| 6,432,256 B1 | 8/2002 | Raoux |
| 6,432,259 B1 | 8/2002 | Noorbakhsh et al. |
| 6,432,831 B2 | 8/2002 | Dhindsa et al. |
| 6,435,865 B1 | 8/2002 | Tseng et al. |
| 6,444,039 B1 | 9/2002 | Nguyen |
| 6,450,117 B1 | 9/2002 | Murugesh et al. |
| 6,451,119 B2 | 9/2002 | Sneh et al. |
| 6,458,416 B1 | 10/2002 | Derderian et al. |
| 6,461,436 B1 | 10/2002 | Campbell et al. |
| 6,461,931 B1 | 10/2002 | Eldridge |
| 6,474,700 B2 | 11/2002 | Redemann et al. |
| 6,503,330 B1 | 1/2003 | Sneh et al. |
| 6,506,254 B1 | 1/2003 | Bosch et al. |
| 6,507,007 B2 | 1/2003 | Van Bilsen |
| 6,509,280 B2 | 1/2003 | Choi et al. |
| 6,534,007 B1 | 3/2003 | Blonigan et al. |
| 6,534,395 B2 | 3/2003 | Werkhoven et al. |

| | | |
|---|---|---|
| 6,540,838 B2 | 4/2003 | Sneh et al. |
| 6,541,353 B1 | 4/2003 | Sandhu et al. |
| 6,551,929 B1 | 4/2003 | Kori et al. |
| 6,562,140 B1 | 5/2003 | Bondestam et al. |
| 6,562,141 B2 | 5/2003 | Clarke |
| 6,573,184 B2 | 6/2003 | Park |
| 6,579,372 B2 | 6/2003 | Park et al. |
| 6,579,374 B2 | 6/2003 | Bondestam et al. |
| 6,589,868 B2 | 7/2003 | Rossman |
| 6,596,085 B1 | 7/2003 | Schmitt et al. |
| 6,602,346 B1 | 8/2003 | Gochberg et al. |
| 6,613,656 B2 | 9/2003 | Li |
| 6,630,201 B2 | 10/2003 | Chiang et al. |
| 6,634,314 B2 | 10/2003 | Hwang et al. |
| 6,635,965 B1 | 10/2003 | Lee et al. |
| 6,638,672 B2 | 10/2003 | Deguchi et al. |
| 6,638,859 B2 | 10/2003 | Sneh et al. |
| 6,638,879 B2 | 10/2003 | Hsieh et al. |
| 6,641,673 B2 | 11/2003 | Yang |
| 6,656,282 B2 | 12/2003 | Kim et al. |
| 6,673,196 B1 | 1/2004 | Oyabu et al. |
| 6,673,689 B2 * | 1/2004 | Al-Shareef et al. ............ 438/381 |
| 6,686,594 B2 | 2/2004 | Kim |
| 6,704,913 B2 | 3/2004 | Rossman |
| 6,705,345 B1 | 3/2004 | Bifano |
| 6,706,334 B1 | 3/2004 | Kobayashi et al. |
| 6,716,284 B2 | 4/2004 | Campbell et al. |
| 6,734,020 B2 | 5/2004 | Lu et al. |
| 6,758,911 B2 | 7/2004 | Campbell et al. |
| 6,773,507 B2 | 8/2004 | Jallepally et al. |
| 6,787,185 B2 | 9/2004 | Derderian et al. |
| 6,787,463 B2 | 9/2004 | Mardian et al. |
| 6,796,316 B2 | 9/2004 | Park et al. |
| 6,800,172 B2 | 10/2004 | Carpenter et al. |
| 6,800,173 B2 | 10/2004 | Chiang et al. |
| 6,814,813 B2 | 11/2004 | Dando et al. |
| 6,818,067 B2 | 11/2004 | Doering et al. |
| 6,818,249 B2 | 11/2004 | Derderian |
| 6,820,570 B2 | 11/2004 | Kilpela et al. |
| 6,821,347 B2 | 11/2004 | Carpenter et al. |
| 6,828,218 B2 | 12/2004 | Kim et al. |
| 6,831,315 B2 | 12/2004 | Raaijmakers et al. |
| 6,838,114 B2 | 1/2005 | Carpenter et al. |
| 6,858,264 B2 | 2/2005 | Dando et al. |
| 6,861,094 B2 | 3/2005 | Derderian et al. |
| 6,869,500 B2 | 3/2005 | Lee et al. |
| 6,884,296 B2 | 4/2005 | Basceri et al. |
| 6,887,521 B2 | 5/2005 | Basceri |
| 6,890,386 B2 | 5/2005 | DeDontney et al. |
| 6,916,398 B2 | 7/2005 | Chen et al. |
| 6,926,775 B2 | 8/2005 | Carpenter et al. |
| 2001/0045187 A1 | 11/2001 | Uhlenbrock |
| 2001/0054484 A1 | 12/2001 | Komino |
| 2002/0073924 A1 | 6/2002 | Chiang et al. |
| 2002/0076507 A1 | 6/2002 | Chiang et al. |
| 2002/0076508 A1 | 6/2002 | Chiang et al. |
| 2002/0100418 A1 | 8/2002 | Sandhu et al. |
| 2002/0104481 A1 | 8/2002 | Chiang et al. |
| 2002/0129768 A1 | 9/2002 | Carpenter et al. |
| 2002/0144655 A1 | 10/2002 | Chiang et al. |
| 2002/0185067 A1 | 12/2002 | Upham |
| 2002/0195056 A1 | 12/2002 | Sandhu et al. |
| 2002/0195201 A1 | 12/2002 | Beer |
| 2002/0197402 A1 | 12/2002 | Chiang et al. |
| 2003/0000473 A1 | 1/2003 | Chae et al. |
| 2003/0003697 A1 | 1/2003 | Agarwal et al. |
| 2003/0003730 A1 | 1/2003 | Li |
| 2003/0023338 A1 | 1/2003 | Chin et al. |
| 2003/0024477 A1 | 2/2003 | Okuda et al. |
| 2003/0027428 A1 | 2/2003 | Ng et al. |
| 2003/0066483 A1 | 4/2003 | Lee et al. |
| 2003/0121608 A1 | 7/2003 | Chen et al. |
| 2003/0192645 A1 | 10/2003 | Liu |
| 2004/0007188 A1 | 1/2004 | Burkhart et al. |
| 2004/0040502 A1 | 3/2004 | Basceri et al. |
| 2004/0040503 A1 | 3/2004 | Basceri et al. |
| 2004/0083959 A1 | 5/2004 | Carpernter et al. |
| 2004/0083960 A1 | 5/2004 | Dando |
| 2004/0099377 A1 | 5/2004 | Newton et al. |
| 2004/0124131 A1 | 7/2004 | Aitchison et al. |
| 2004/0154538 A1 | 8/2004 | Carpenter et al. |
| 2004/0226507 A1 | 11/2004 | Carpenter et al. |
| 2005/0016984 A1 | 1/2005 | Dando |
| 2005/0022739 A1 | 2/2005 | Carpenter et al. |
| 2005/0028734 A1 | 2/2005 | Carpenter et al. |
| 2005/0039680 A1 | 2/2005 | Beaman et al. |
| 2005/0039686 A1 | 2/2005 | Zheng et al. |
| 2005/0045100 A1 | 3/2005 | Derderian |
| 2005/0045102 A1 | 3/2005 | Zheng et al. |
| 2005/0059261 A1 | 3/2005 | Basceri et al. |
| 2005/0061243 A1 | 3/2005 | Sarigiannis et al. |
| 2005/0081786 A1 | 4/2005 | Kubista et al. |
| 2005/0087130 A1 | 4/2005 | Derderian |
| 2005/0087302 A1 | 4/2005 | Mardian et al. |
| 2005/0120954 A1 | 6/2005 | Carpenter et al. |
| 2005/0126489 A1 | 6/2005 | Beaman et al. |
| 2005/0133161 A1 | 6/2005 | Carpenter et al. |
| 2005/0145337 A1 | 7/2005 | Derderian et al. |
| 2005/0164466 A1 | 7/2005 | Zheng et al. |
| 2005/0217575 A1 | 10/2005 | Gealy et al. |
| 2005/0249873 A1 | 11/2005 | Sarigiannis et al. |
| 2005/0249887 A1 | 11/2005 | Dando et al. |
| 2005/0268856 A1 | 12/2005 | Miller et al. |
| 2006/0134345 A1 | 6/2006 | Rueger et al. |
| 2006/0165873 A1 | 7/2006 | Rueger et al. |

FOREIGN PATENT DOCUMENTS

| | | |
|---|---|---|
| JP | 63-256460 A | 10/1988 |
| JP | 1-273991 A | 11/1989 |
| JP | 4-100533 A | 4/1992 |
| JP | 4-213818 A | 8/1992 |
| JP | 6-151558 A | 5/1994 |
| JP | 6-342785 A | 12/1994 |
| JP | 08-034678 A | 2/1996 |
| JP | 9-82650 A | 3/1997 |
| JP | 10-223719 A | 8/1998 |
| JP | 11-172438 A | 6/1999 |
| JP | 2001-82682 A | 3/2001 |
| JP | 2001-261375 A | 9/2001 |
| JP | 2002-164336 A | 6/2002 |
| JP | 2001-254181 A | 9/2002 |
| SU | 598630 | 2/1978 |
| WO | 98/37258 A1 | 8/1998 |
| WO | 99/06610 A1 | 2/1999 |
| WO | 00/40772 A1 | 7/2000 |
| WO | 00/63952 A1 | 10/2000 |
| WO | 00/65649 A1 | 11/2000 |
| WO | 00/79019 A1 | 12/2000 |
| WO | 01/46490 A1 | 6/2001 |
| WO | 02/45871 A1 | 6/2002 |
| WO | 02/48427 A1 | 6/2002 |
| WO | 02/073329 A2 | 9/2002 |
| WO | 02/073660 A2 | 9/2002 |
| WO | 02/081771 A2 | 10/2002 |
| WO | 02/095807 A2 | 11/2002 |
| WO | 03/008662 A2 | 1/2003 |
| WO | 03/016587 A1 | 2/2003 |
| WO | 03/028069 A2 | 4/2003 |
| WO | 03/033762 A1 | 4/2003 |
| WO | 03/035927 A2 | 5/2003 |
| WO | 03/052807 A1 | 6/2003 |

OTHER PUBLICATIONS

Cameron, I., "Atomic Layer Deposition Chamber Works at Low Temperatures", 2 pages, Electronic Times, Jul. 19, 2001, <http://www.electronictimes.com/story/OEG20010719S0042>.

Cowin, J.P., et al., "Measurement of Fast Desorption Kinetics of D2 From Tungsten by Laser Induced Thermal Desorption," Surface Science, vol. 78, pp. 545-564, 1978, North-Holland Publishing Company.

Cutting Edge Optronics, 600W QCW Laser Diode Array, Part Number: ARR48P600, 2 pages, Oct. 2001, <www.ceolaser.com>.

Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.

Deublin Company, "Rotating Unions", 1 page, retrieved from the Internet on Feb. 4, 2002, <http://www.com/products/rotatingunions.htm>.

Deublin Company, "Sealing,"2 pages, retrieved from the Internet on Feb. 4, 2002, <http://www.deublin.com/products/sealing.htm>.

Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The Americal Chemical Society.

Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation, Cleveland, OH, 1998).

Henning, A.K. et al., "Contamination Reduction Using MEMS-BASED, High-Precision Mass Flow Controllers," Proceedings, SEMICON West Symposium on Contamination Free Manufacturing for Semiconductor Processing (SEMI, Mountain View, CA, 1998), pp. 1-11.

Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.

Henning, A.K., "Microfluidic MEMS," Proceedings, IEEE Aerospace Conference, Paper 4.906 (IEEE Press, Piscataway, NJ, 1998), 16 pages.

Henning, A.K., et al., "A thermopneumatically actuated microvalve for liquid expansion and proportional control", Proceedings, Transducers '97: 1997 International Solid State Sensors and Actuators Conference, pp. 825-828.

Henning, A.K., et al., "Microfluidic MEMS for Semiconductor Processing," IEEE Trans. Components, Packaging, and Manufacturing Technology B21, pp. 329-337, 1998.

Henning, A.K., et al., "Performance of MEMS-Based Gas Distribution and Control Systems for Semiconductor Processing", 8 pages, Proceeedings, SEMICON West Workshop on Gas Distribution (SEMI, Mountain View, CA, 1998).

Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.

Integrated Process Systems Ltd., "ALD & CVD", 2 pages, retrieved from the internet on Dec. 11, 2001, <http://www.ips-tech.com/eng/pro-p2-2.htm>.

Integrated Process Systems Ltd., "Nano-ALD", 2 pages, retrieved from the Internet on Dec. 11, 2001, <http://www.ips-tech.com/eng/pro-p2.htm>.

Integrated Process Systems Ltd., "Welcome to IPS Ltd.", 1 page, retrieved from the Internet on Dec. 11, 2001, <http://www.ips-tech.com/eng/main.htm>.

Maillefer, D., et al., "A High-Performance Silicon Micropump for Disposable Drug Delivery Systems," pp. 413-417, IEEE, 2001.

Olsson, A., "Valve-less Diffuser Micropumps", ISSN 0281-2878, 66 pages, 1998.

Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.

Ready, J.F., "Effects Due to Absorption of Laser Radiation," Journal of Applied Physics, vol. 36, No. 2, pp. 462-468, Feb. 1965, Journal of Applied Physics, American Institute of Physics.

Takahashi, K. et al., "Process Integration of 3D Chip Stack with Vertical Interconnection," pp. 601-609, 2004 Electronic Components and Technology Conference, IEEE, Jun. 2004.

The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.

Tokyo Electron Limited, Plasma Process System, Trias SPA, 1 page, retrieved from the Internet on Oct. 16, 2004, <http://www.tel.com/eng/products/spe/sdtriasspa.htm>.

U.S. Appl. No. 09/651,037, filed Aug. 30, 2000, to Mardian.

University of California, Berkeley, University Extension, "Atomic Layer Deposition," 5 pages, Sep. 24-25, 2001, <http://www.unex.berkeley.edu/eng/br225/1-1.html>.

Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.

* cited by examiner

METHODS FOR FORMING SMALL-SCALE CAPACITOR STRUCTURES

CROSS-REFERENCE TO RELATED APPLICATION

This application is a divisional of U.S. application Ser. No. 10/767,298 filed Jan. 28, 2004, now U.S. Pat. No. 7,906,393, which is incorporated herein by reference in its entirety.

TECHNICAL FIELD

The present invention is related to methods for forming capacitors on microfeature workpieces, e.g., semiconductor substrates. Aspects of the invention have particular utility in connection with forming capacitors for use in microelectronic components, e.g., DRAM capacitors.

BACKGROUND

Recent advances in the miniaturization of integrated circuits have led to smaller chip areas available for devices. High density dynamic random access memory chips (DRAMs), for example, leave little room for the storage node of a memory cell. Yet, the storage node (capacitor) must be able to store a certain minimum charge, determined by design and operational parameters, to ensure reliable operation of the memory cell. It is thus increasingly important that capacitors achieve a high stored charge per unit of chip area occupied.

Traditionally, capacitors integrated into memory cells have structures based on the parallel plate capacitor. A layer of dielectric is disposed between two conductive layers and the layers are patterned, either sequentially during deposition or all at once. The patterned dielectric layer becomes the capacitor dielectric while the patterned conductive layers become the top and bottom plates or electrodes of the resultant capacitor structure. The charge stored on the capacitor is proportional to the capacitance (C) of the capacitor, $C=K K_0 A/d$, where K is the dielectric constant of the capacitor dielectric, $K_0$ is the vacuum permittivity, A is the electrode area, and d is the spacing between electrodes.

Several techniques have been developed to increase the total charge capacity of the cell capacitor without significantly affecting the chip area occupied by the cell. These include increasing the effective surface area (A) of the electrodes by creating folding structures, such as trench or stacked capacitors. Such structures better utilize the available chip area by creating three-dimensional shapes to which the conductive electrodes and interlayer dielectric conform.

One common way to increase the surface area of the capacitor electrodes employs a roughened or texturized electrode surface. U.S. Patent Application Publication 2003/0003697 to Agarwal et al. (the entirety of which is incorporated by reference), for example, suggests a roughened electrode surface that may comprise annealed ruthenium oxide. More conventionally, roughened polycrystalline silicon (commonly referred to as "polysilicon," or simply "poly") in the form of hemispherical grained polysilicon (commonly referred to as "HSG silicon" or "HSG polysilicon") has been used for a number of years as the bottom or storage electrode of microelectronic capacitors. Such bottom electrodes are commonly in contact with an active area of a silicon substrate that comprises part of a transistor. A thin dielectric layer is formed atop the bottom electrode and typically conforms reasonably well to the rough electrode surface. A top electrode may be deposited on the dielectric layer. The conformality of the dielectric layer commonly provides the outer surface of the dielectric layer with a roughened surface as well. The use of a rough bottom electrode, e.g., a layer of HSG polysilicon, thus effectively increases the electrode area (A in the capacitance formula above), which increases the capacitance of the capacitor structure.

As a bottom electrode for a capacitor, however, roughened polysilicon is typically doped for conductivity to allow the bottom electrode to hold the requisite amount of charge. Unfortunately, rough polysilicon deposition techniques, such as HSG vacuum annealing, are most effective at lower doping levels. Further doping the polysilicon of the bottom electrode tends to result in diffusion of the dopants through the bottom electrode to the underlying active area of the substrate. For example, phosphorus from solid source $P_2O_5$, a commonly employed dopant, diffuses easily through silicon during high temperature anneal steps. Downwardly diffused dopants can interfere with junction operation by changing the dopant profile of the active area and the transistor characteristics. Although some implanted dopants, such as arsenic ions, tend to diffuse more slowly, they may fail to adequately dope vertical surfaces, are often unduly expensive, and generally do not entirely eliminate the diffusion problem.

Some have proposed depositing an electrically conductive layer on top of a HSG silicon bottom electrode. For example, U.S. Pat. No. 6,211,033, issued to Sandhu et al. (the entirety of which is incorporated herein by reference), suggests depositing a layer of titanium nitride or titanium carbonitride on the outer surface of an HSG silicon electrode. The use of such a conductive overcoat can lead to greater conductivity in the bottom electrode with less doping of the HSG silicon layer and decreased diffusion of dopants. Such a titanium nitride or titanium carbonitride layer can also serve as an interface for high-stress locations in the HSG silicon layer, reducing the risk of cracking of the dielectric layer and the resultant current leakage. This Sandhu et al. patent suggests forming the titanium nitride or titanium carbonitride layer by metal organic chemical vapor deposition (MOCVD) employing tetrakis (dimethylamido)titanium (TDMAT) and a nitrogen carrier gas, or by CVD with a titanium halide, e.g., $TiCl_4$, as the titanium source and ammonia as the nitrogen source. Both of these CVD techniques can introduce significant levels of impurities in the resultant titanium nitride or titanium carbonitride film. Using MOCVD can incorporate carbon as an impurity in the form of titanium carbide. If the titanium nitride layer is instead deposited using titanium chloride and ammonia, chlorine atoms from the $TiCl_4$ can be incorporated in the deposited material and diffuse into the silicon.

DETAILED DESCRIPTION

A. Overview

Figure 1:
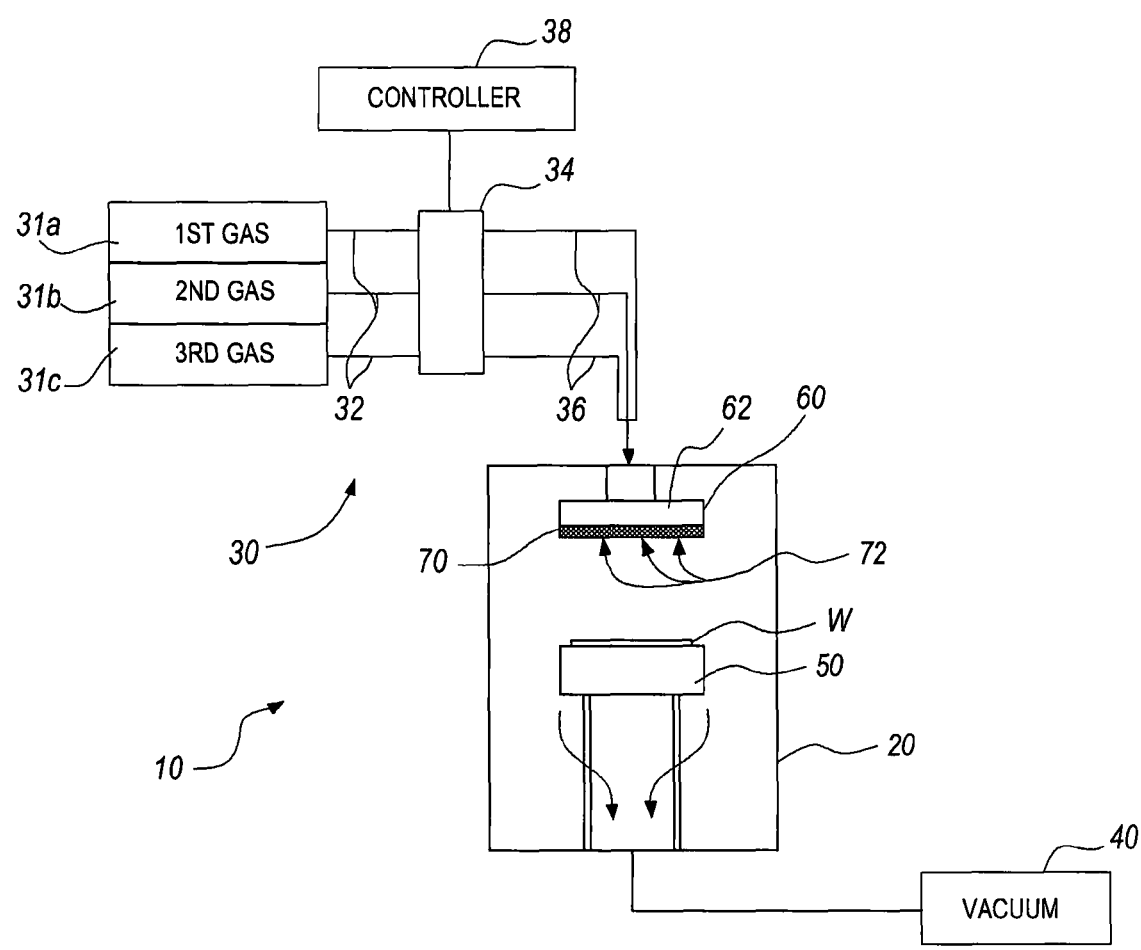
FIG. 1 is a schematic representation of a system including a reactor for depositing a material on a single microfeature workpiece in accordance with select embodiments of the invention.

Various embodiments of the present invention provide methods of forming capacitors, e.g., capacitors employed as features of microelectronic components. Other embodiments of the invention provide microelectronic components that include capacitors. The term "microfeature workpiece" is used throughout to include substrates upon which and/or in which microelectronic devices, micromechanical devices, data storage elements, read/write components, and other features are fabricated. For example, microfeature workpieces can be semiconductor wafers such as silicon or gallium arsenide wafers, glass substrates such as borophosphosilicate glass (BPSG), and other types of materials. The microfeature workpieces typically have submicron features with dimensions of 0.05 microns or greater. Furthermore, the terms "gas" and "gaseous" are used throughout to include any form of matter that has no fixed shape and will conform in volume to the space available, which specifically includes vapors (i.e., a gas having a temperature less than the critical temperature so that it may be liquefied or solidified by compression at a constant temperature).

Several embodiments in accordance with the invention are set forth in FIGS. 1-14 and the following text to provide a thorough understanding of particular embodiments of the invention. A person skilled in the art will understand, however, that the invention may have additional embodiments, or that the invention may be practiced without several of the details of the embodiments shown in FIGS. 1-14.

One embodiment of the invention provides a method of fabricating a capacitor that includes forming a first electrode on a surface of a microfeature workpiece, forming a dielectric layer on the first electrode, and forming a second electrode over the dielectric layer. At least one of the first and second electrodes is formed by a) reacting a first gaseous precursor and a second gaseous precursor to deposit a first electrically conductive layer at a first deposition rate, and b) depositing a second electrically conductive layer at a second deposition rate that is less than the first deposition rate by depositing a precursor layer of a third gaseous precursor (which may be the same as the first precursor) at least one monolayer thick and exposing the precursor layer to a fourth gaseous precursor (which may be the same as the second precursor) to form a nanolayer reaction product. The second electrically conductive layer is in contact with the dielectric layer and may have a thickness of no greater than about 50 Å.

A method of fabricating a microelectronic capacitor in accordance with another embodiment of the invention includes depositing first and second conductive layers and, thereafter, depositing a dielectric layer and depositing an electrode on the dielectric layer. The first conductive layer is deposited at a first rate by reacting a first gaseous precursor and a second gaseous precursor in a first reaction process. The first conductive layer has a first surface roughness and a first impurity content. The second conductive layer is deposited at a second rate, which is slower than the first rate, by reacting the first gaseous precursor and the second gaseous precursor in a second reaction process. The second conductive layer has a second surface roughness that is smoother than the first surface roughness and a second impurity content that is lower than the first impurity content.

A method of fabricating a microelectronic capacitor in accordance with another embodiment of the invention includes positioning a microfeature workpiece in a process chamber and forming an electrically conductive structure on a surface of the microfeature workpiece. This surface may comprise a patterned layer of the microfeature workpiece or the surface of a previously-deposited layer or coating. This electrically conductive structure may be formed by sequentially depositing first, second, third, and fourth electrically conductive layers. The first electrically conductive layer is deposited by a first deposition process that comprises contemporaneously introducing a first gaseous precursor and a second gaseous precursor to the process chamber to form a first reaction product. The second electrically conductive layer is deposited on the first electrically conductive layer by a second deposition process. This second deposition process may comprise alternately introducing quantities of the first and second precursors to the process chamber to form at least two layers of a second reaction product. The third electrically conductive layer may be deposited on the second electrically conductive layer by the first deposition process outlined above, and the fourth electrically conductive layer may be deposited on the third electrically conductive layer by the second deposition process outlined above.

Yet another embodiment of the invention provides a microelectronic component comprising a plurality of memory cells carried by a substrate. Each memory cell includes a capacitor that comprises a first electrode, a dielectric layer and a second electrode deposited on the dielectric layer. The first electrode includes, moving outwardly from a surface of the substrate, a hemispherical grain polycrystalline silicon layer, a layer of a bulk deposition product comprising a primary species, and a layer of a nanolayer deposition product comprising the same primary species. The layer of the nanolayer deposition product has a thickness of no greater than 50 Å and the bulk deposition product has an impurity content higher than an impurity content of the nanolayer deposition product. The dielectric layer is deposited on the nanolayer deposition product of the first electrode.

For ease of understanding, the following discussion is subdivided into two areas of emphasis. The first section discusses aspects of processing systems that may be used in accordance with selected embodiments of the invention. The second section outlines methods in accordance with other aspects of the invention.

B. Processing Systems

FIG. 1 schematically illustrates a reactor 10 that may be used to form capacitors in accordance with select embodiments of the invention. The reactor 10 of FIG. 1 includes a process chamber 20 coupled to a gas supply 30 and a vacuum 40. The reactor 10 may also include a heater plate 50 that supports the microfeature workpiece W and a gas dispenser 60, both of which are disposed in the process chamber 20. The gas dispenser 60 includes a plenum 62 operatively coupled to the gas supply 30 and a distributor plate 70 having a plurality of holes 72. In operation, the heater plate 50 may heat the workpiece W to a desired reaction temperature and the desired combination or series of gases may be injected into the process chamber 20 via the gas dispenser 60. The vacuum 40 can maintain a negative pressure in the process chamber 20 to draw the gases from the gas dispenser 60 across the workpiece W and then through an outlet in the process chamber 20.

The gas supply 30 of the reactor 10 shown in FIG. 1 includes a plurality of gas sources 31 (identified individually as 31a-c), a valve assembly 34 having a plurality of valves, and a plurality of gas supply lines 32 and 36. The gas sources 31 can include any number of gases anticipated to be needed for various reactions in the process chamber 20. In the particular embodiment shown schematically in FIG. 1, the gas sources 31 include a first gas source 31a for providing a first gas, a second gas source 31b for providing a second gas, and a third gas source 31c for providing a third gas. In one example, the first and second gases can be first and second precursors, respectively, and the third gas can be a purge gas. As discussed in more detail below, the first and second precursors may be chemical species that react to form a reaction product on a surface of the microfeature workpiece W. The gas supply 30 can include more gas sources 31 for other applications that require additional precursors or purge gases. For example, the first and second precursors may be used to deposit an electrically conductive layer or layers and an additional precursor or precursors may be provided in additional gas sources 31 (not shown) to deposit a dielectric layer as described below.

The valve assembly 34 may be operated by a controller 38 that generates signals for controlling the flow of gases to the reaction chamber 20. In one embodiment, this controller 38 comprises a computer having a programmable processor programmed to control operation of the valve assembly 34 to deposit material on the workpiece W. If so desired, the controller 38 may also be coupled to the vacuum 40 and/or the heater 50 to further control the reaction conditions adjacent the surface of the workpiece W. For example, the controller 38 can be programmed to heat the workpiece to a desired temperature via the heater 50 and operate the valve assembly 34 to pulse quantities of different gases individually through the gas distributor 60 in atomic layer deposition (ALD) applications or mix selected precursors in the plenum 62 of the gas distributor 60 in continuous or pulsed CVD processes.

Figure 2:
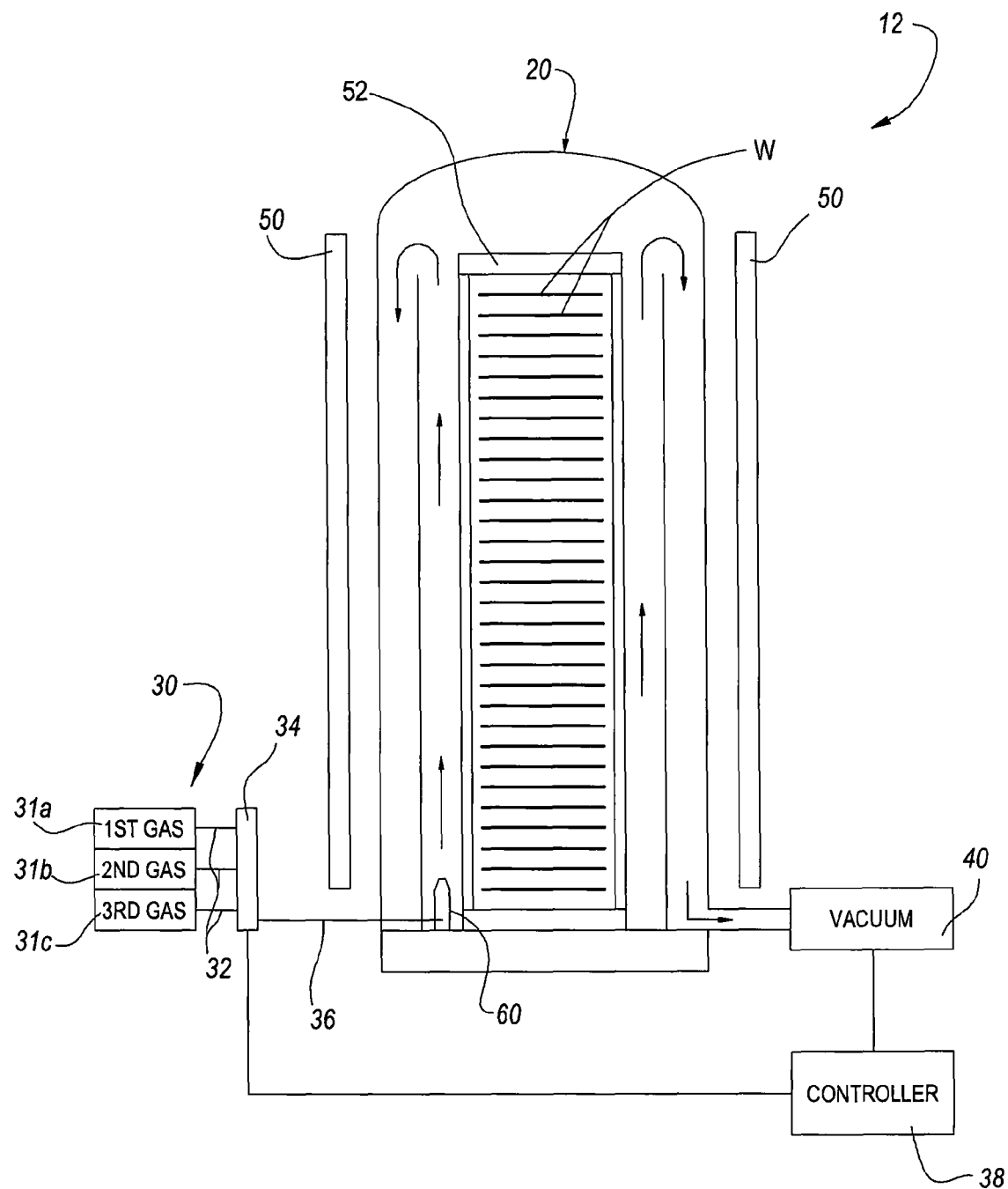
FIG. 2 is a schematic representation of a system including a reactor for depositing a material on surfaces of multiple microfeature workpieces in accordance with other embodiments of the invention.

The reactor 10 of FIG. 1 is adapted to receive and process a single microfeature workpiece W in the process chamber 20. To increase throughput of CVD and ALD processes, the microelectronics industry, for example, is moving toward batch processing of workpieces W. FIG. 2 schematically illustrates a reactor 12 adapted for batch processing of workpieces W. Many of the elements of this batch reactor 12 are similar to the reactor 10 of FIG. 1 and like reference numbers are used to designate similar elements. In the embodiment of FIG. 1, the workpiece W is supported on a heater plate 50 that is also adapted to heat the workpiece W. In the batch reactor 12, one or more workpieces W may be supported in the process chamber 20 by a workpiece holder 52. For example, the workpiece holder 52 may be adapted to hold anywhere from 20 to 250 microfeature workpieces W for concurrent processing. The microfeature workpieces W may be heated during processing by one or more radiant heat panels 50 arranged about the periphery of the process chamber 20.

C. Methods of Depositing Materials on Micro-Device Workpieces

As noted above, other embodiments of the invention provide methods of forming capacitors, e.g., by forming a capacitor on a microfeature workpiece for use as a microelectronic capacitor. In the following discussion, reference is made to the processing system 10 shown schematically in FIG. 1. It should be understood, though, that reference to this particular processing system is solely for purposes of illustration and that the methods outlined below are not limited to any particular processing system.

Deposition Techniques

As discussed below, various embodiments of the invention employ both chemical vapor deposition (CVD) and atomic layer deposition (ALD). Both CVD and ALD, as used herein, involve the use of at least one chemical species that can decompose or can react with another chemical species to form a desired material on the workpiece W. Such chemical species are referred to herein as "precursors." One of the differences between a CVD process employing two or more precursors and an ALD precursor employing two or more precursors is the relative timing of the delivery of the precursors to the proximity of the workpiece W. In CVD processes, both of the precursors are simultaneously present in and react in a space adjacent the surface of the workpiece W; in conventional ALD processes, the precursors are introduced separately and primarily react directly on the surface of the workpiece W.

CVD is commonly used to deposit a completed reaction product on a surface of a workpiece W. The conditions adjacent a workpiece surface may be used to catalyze a gas-phase reaction or decomposition of the precursor(s) to form a reaction product. This completed reaction product is deposited on the surface of the workpiece W. Commonly, both of the precursors in a two-precursor CVD process are introduced contemporaneously, i.e., during an overlapping period of time.

Figure 3:
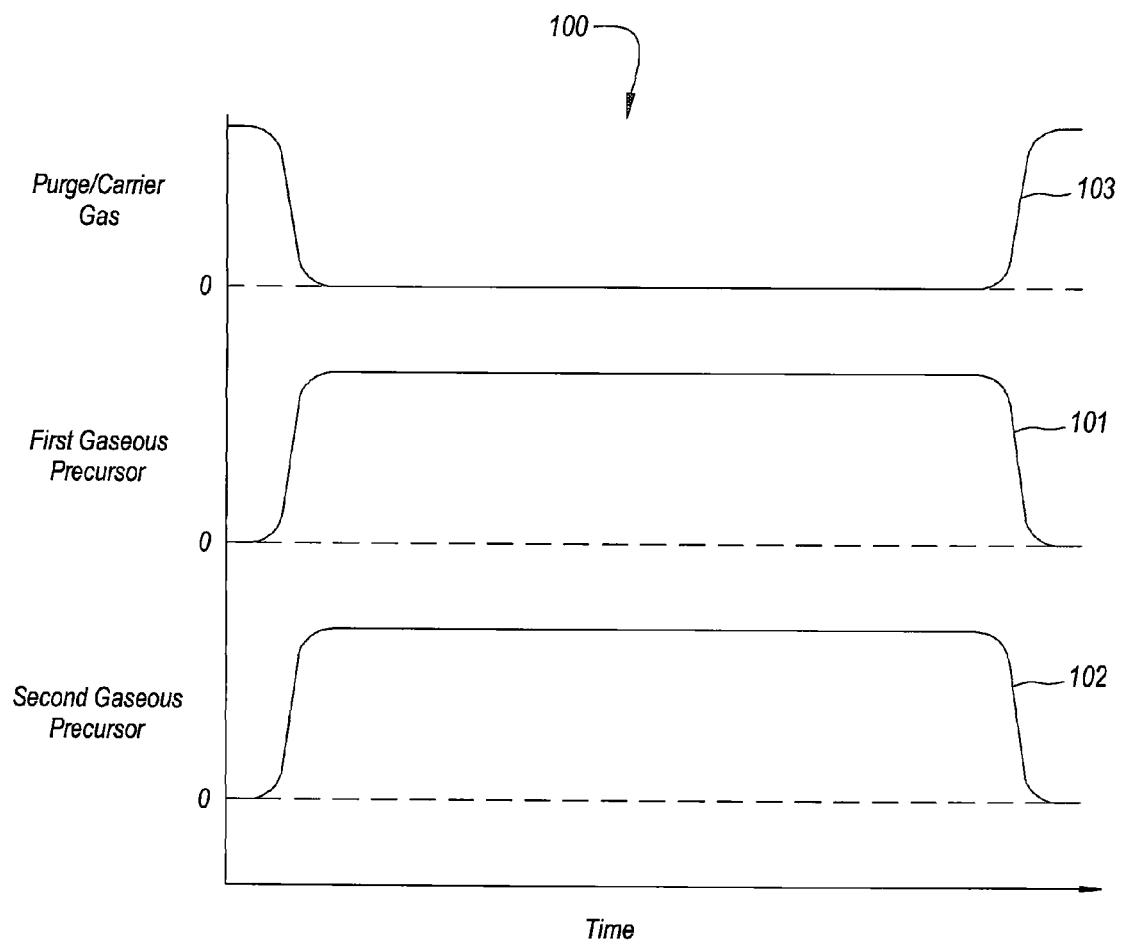
FIG. 3 is a schematic illustration of one exemplary process for forming an electrically conductive layer in accordance with one aspect of the invention.

FIG. 3 schematically illustrates a gas flow of a CVD process 100 in accordance with one embodiment of the invention as a plot of flow rate over time. In this process 100, a first gaseous precursor flow 101 and a second gaseous precursor flow 102 are contemporaneously delivered to the process chamber 20 of the reactor 10. This may be accomplished by controlling the valve assembly 34 to deliver the first precursor from the first gas source 31a and the second precursor from the second gas source 31b. Both of these gases are delivered to the plenum 62 of the gas dispenser 60, where they will at least begin to be mixed together. This mixture of gases can then be delivered to the proximity of the workpiece W by the distributor plate 70. In FIG. 3, the first gas flow 101 and the second gas flow 102 are shown as starting and ending at substantially the same time. In other embodiments, the first gas flow 101 may start before or after the second gas flow 102 is initiated and the first gas flow 101 may be terminated before or after the second gas flow 102 is terminated. In each of these cases, the first gas flow 101 and the second gas flow 102 may be said to be contemporaneous if they occur simultaneously over a material period of time, i.e., they need not start and/or stop at the same time.

FIG. 3 schematically illustrates delivery of a purge/carrier gas. In this embodiment, the purge gas may be delivered before initiating the first and second gas flows 101 and 102 and again delivered to the process chamber 20 after the first and second gas flows 101 and 102 are terminated. Such a purge gas flow 103 may be used in conjunction with the vacuum 40 to purge any excess precursors from the process chamber 20. In other embodiments, the purge/carrier gas may be delivered contemporaneously with the first and second gaseous precursors, in which case it serves as a more conventional carrier gas to provide adequate gas flow through the dispenser 60 while controlling the concentration of the precursors in the gas flow. In the context of FIG. 1, the third gas flow 103 may be delivered by selectively controlling the valve assembly 34 to deliver the purge gas from the third gas source 31c to the gas dispenser 60.

Figure 4:
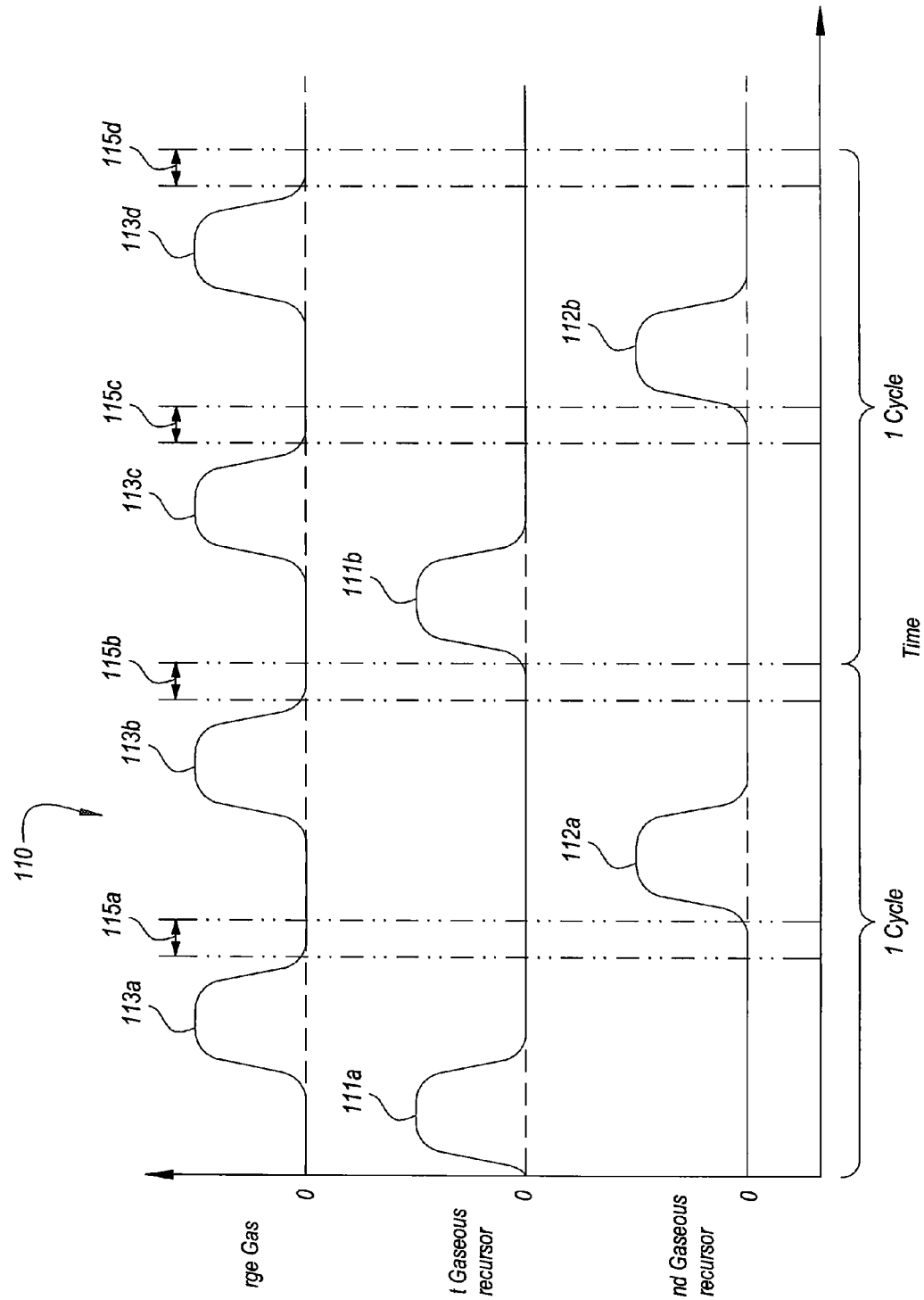
FIG. 4 is a schematic illustration of one exemplary process for forming another electrically conductive layer in accordance with another aspect of the invention.

Atomic layer deposition, in contrast with CVD, generally involves delivering precursors in alternating pulses rather than delivering them contemporaneously. FIG. 4 is a schematic plot of gas flow rates as a function of time in accordance with an ALD process 110 in accordance with one embodiment of the invention. In this process 110, discrete quantities of the first gaseous precursor are delivered in first precursor pulses 111a and 111b. Discrete quantities of the second gaseous precursor are delivered to the process chamber 20 in second precursor pulses 112a and 112b. The first pulses 111 and second pulses 112 are delivered at different times in an alternating fashion.

Moving down the timeline of FIG. 4, one pulse 111a of the first precursor may be delivered to the process chamber 20 to contact the surface of the workpiece W. The precursor may be at least chemisorbed on the workpiece W. Theoretically, such chemisorbtion will form a monolayer that is uniformly one molecule thick on the entire surface of the workpiece W. Such a monolayer may be referred to as a saturated monolayer. As a practical matter, in some circumstances some minor portions of the workpiece surface may not chemisorb a molecule of the precursor. Nevertheless, such imperfect monolayers are still referred to herein as monolayers. In many applications, a substantially saturated monolayer may be suitable. A substantially saturated monolayer is a monolayer that will yield a deposited layer exhibiting the requisite quality and/or electrical properties.

An excess of the first precursor is typically delivered to the process chamber 20. This excess first precursor can be purged from the vicinity of the workpiece surface. Purging may involve a variety of techniques, including any combination of contacting the substrate and/or monolayer with a purge gas and/or lowering pressure in the process chamber 20 to below the pressure needed to deposit the precursor on the workpiece surface. Examples of suitable carrier gases include nitrogen, argon, helium, neon, krypton, and xenon. In the particular embodiment shown in FIG. 4, a first pulse 113a of the purge gas is delivered to the process chamber 20 and a majority or all of this purge gas pulse 113a may take place after the first precursor pulse 111a is completed. The purge process shown in FIG. 4 also includes a pump-down step 115a wherein the vacuum 40 will withdraw gas from the process chamber 20 without introducing any additional gas from the gas supply 30. The parameters of the purge pulse 113a and pump-down 115a may be determined experimentally, as known in the art. The pump-down time and/or the quantity of purge gas in the pulse 113a may be successively reduced until the film growth rate increases. Such an increase in film growth rate may be deemed an indication that excess quantities of the first precursor remain in the process chamber 20, which may be used to establish a minimum purge gas quantity and/or purge time.

Once the process chamber 20 has been suitably purged, a pulse 112a of the second gaseous precursor may be delivered to the process chamber 20. This second precursor may chemisorb on the first monolayer of the first precursor and/or react with the monolayer to form a reaction product. This reaction product is typically one or no more than a few molecules thick, yielding a very thin, highly conformal nanolayer reaction product. After a suitable exposure to the second gaseous precursor, the second precursor pulse 112a may be terminated and the process chamber 20 may be purged again with a pulse 113b of purge gas and/or a pump-down step 115b.

As suggested in FIG. 4, the pair of precursor pulses 111a and 112a, together with the associated pulses 113a and 113b of purge gas and/or pump-down steps 115a and 115b, may be considered one cycle. This cycle will form a nanolayer that is usually thinner than the desired total thickness, with typical thicknesses of just 1 or 2 molecules (e.g., less than 1 nm, often less than 2 Å). As a consequence, the cycle is often repeated numerous times to yield a layer with an appropriate thickness. Hence, FIG. 4 illustrates a second cycle that involves delivering a further pulse 111b of the first precursor, purging the process chamber 20 with a further purge gas pulse 113c and pump-down 115c, subsequently delivering another second precursor pulse 112b, and again purging the process chamber 20 with another purge gas pulse 113d and pump-down 115d. This process can be repeated as many times as necessary to yield a layer of the desired thickness.

Figure 5:
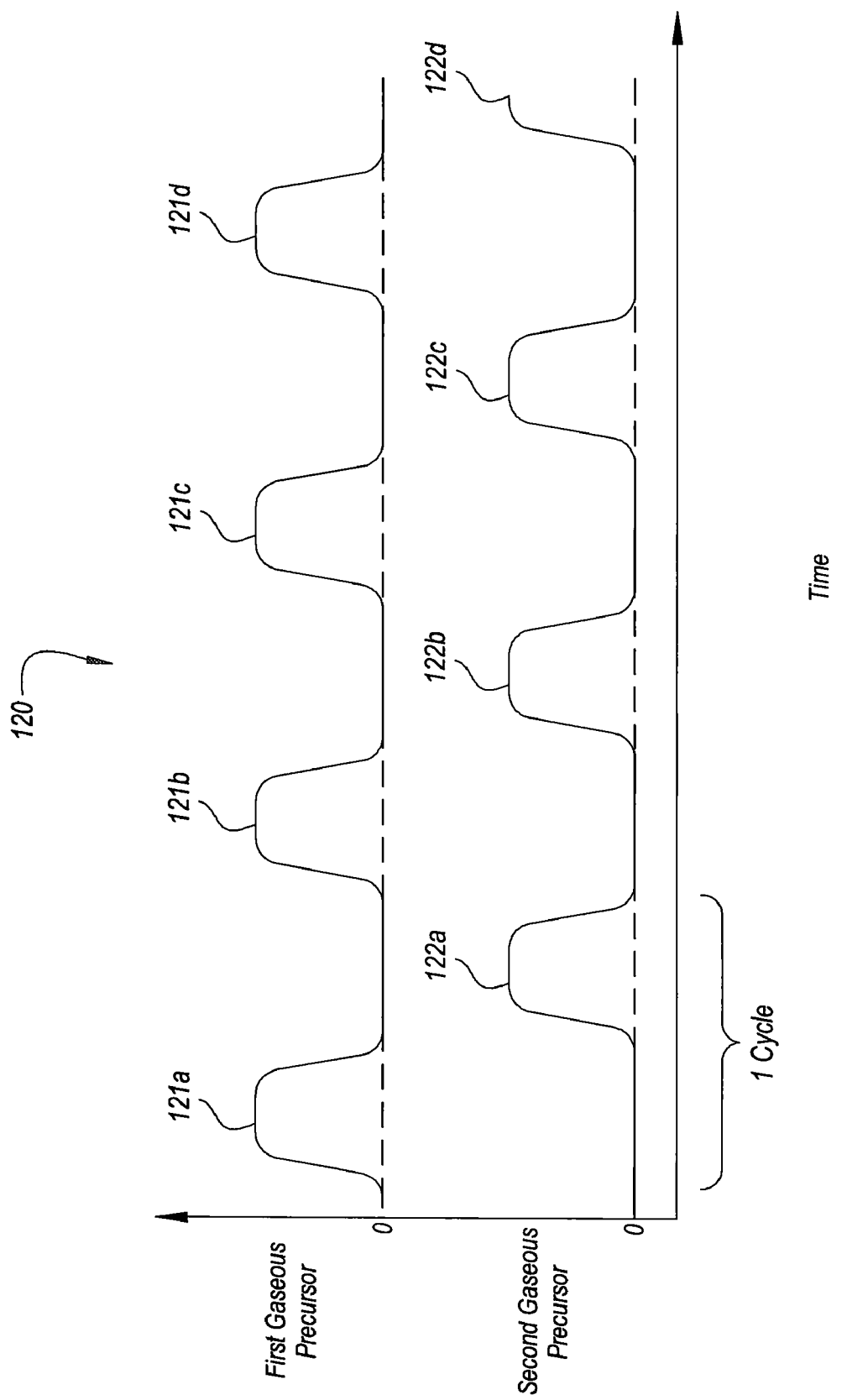
FIG. 5 is a schematic illustration of an alternative process for forming an electrically conductive layer in accordance with still another aspect of the invention.

FIG. 5 schematically illustrates a gas flow profile analogous to FIG. 4, but illustrating a process 120 in accordance with another embodiment of the invention. In this process 120, pulses 121a-d of the first gaseous precursor are alternated with pulses 122a-d of the second gaseous precursor. This is similar in some respects to the pulses 111 and 112 illustrated in FIG. 4 in the process 120 shown in FIG. 5. However, there is no purge process (e.g., purge pulse 113a and pump-down 115a in FIG. 4) between delivery of successive quantities of the first and second precursors. Hence, in FIG. 5, the first pulse 122a of the second gaseous precursor may immediately follow completion of the first pulse 121a of the first gaseous precursor. Likewise, the next pulse 121b of the first precursor may immediately follow termination of the first pulse 122a of the second precursor. In this process, a monolayer of the first precursor may be deposited on the surface of the workpiece prior to delivery of the pulse of the second precursor. Without the purge phase, though, some of the first precursor may remain in the vicinity of the workpiece W when the next pulse of the second gaseous precursor is initiated. This may result in a gaseous phase reaction between the precursors in a gaseous, unbound phase, leading to direct deposition of the reaction product on the surface of the workpiece W, and an increase in the rate of film formation. By appropriately selecting the process conditions and the timing of the pulses 121 and 122, though, this CVD-like secondary deposition may be held in check and may not significantly adversely affect the quality of the ALD-deposited material.

In other embodiments, the process chamber 20 may be purged between some, but not all, precursor pulses. For example, one pulse (e.g., 121a) of the first precursor and one pulse (e.g., 122a) of the second precursor may form one cycle of material deposition. A purge step, which may comprise delivery of a purge gas and/or a pump-down of the process chamber 20, may be performed between cycles to better promote deposition of a monolayer of the first precursor on the layer of material deposited in the previous cycle.

The process 120 shown in FIG. 5 may not technically conform to conventional definitions of atomic layer deposition because remnants of one precursor are present when the subsequent precursor is introduced. Nonetheless, it is anticipated that such a "pseudo-ALD" process may deliver many of the benefits desired from ALD layers in accordance with select methods outlined below. As a consequence, the term "ALD" is used herein to refer to both conventional ALD, (e.g., deposition via the process 110 illustrated in FIG. 3) and "pseudo-ALD" (e.g., deposition via the process 120 shown in FIG. 4).

Under most CVD conditions, the reaction between the precursors occurs largely independently of the composition or surface properties of the workpiece on which the reactant is being deposited. By contrast, the chemisorbtion rate of a precursor in ALD may be influenced by the composition, crystalline structure, and other properties of the workpiece surface, including any previously chemisorbed chemical species on that surface. If necessary, the surface of the workpiece can be prepared before ALD to enhance the deposition of the monolayer of the first precursor. For example, if an ALD layer is to be formed on HSG silicon, it may be advantageous to expose the HSG silicon to water vapor to provide —OH termination at the surface.

ALD and CVD processes each have some advantages and disadvantages. The primary advantage of CVD in the context of the present invention is that it may deposit material at a significantly higher rate than ALD processes. Whereas CVD techniques may require only about one minute to form a 60 Å thick layer, for example, ALD techniques using analogous precursors may take several minutes to form a layer having the same thickness by depositing a series of nanolayers. In single-wafer processing chambers, ALD processes can take 500-2000 percent longer than corresponding single-wafer CVD processes.

Although ALD may take appreciably longer than CVD, materials deposited via ALD are often superior in a number of respects to analogous materials deposited via CVD. For example, building up a layer of ALD material as a series of independently deposited nanolayers can yield significantly higher conformality to underlying surface roughness than is typically achieved using CVD with the same precursors. Layers deposited via CVD also tend to include a significantly higher concentration of impurities than an analogous material deposited via ALD. As noted above in connection with U.S. Pat. No. 6,211,033, depositing titanium nitride or titanium carbonitride via MOCVD (e.g., TDMAT/nitrogen) or CVD (e.g., $TiCl_4$/$NH_3$) can incorporate undesirable amounts of carbon and/or chlorine in the resultant layer. The crystallinity and crystal habit of the layer deposited via CVD will vary depending on the process conditions, but the grain size in crystalline CVD films is often larger than any grains that may develop in ALD films. This tends to produce a rougher surface on CVD-deposited layers than on analogous ALD-deposited layers. Particularly if the dielectric is not deposited in a highly conformal deposition process, this microroughness of CVD layers may adversely impact the quality of the electrical interface between a CVD-deposited electrode and an overlying dielectric layer.

Manufacturing Processes

Figure 6:
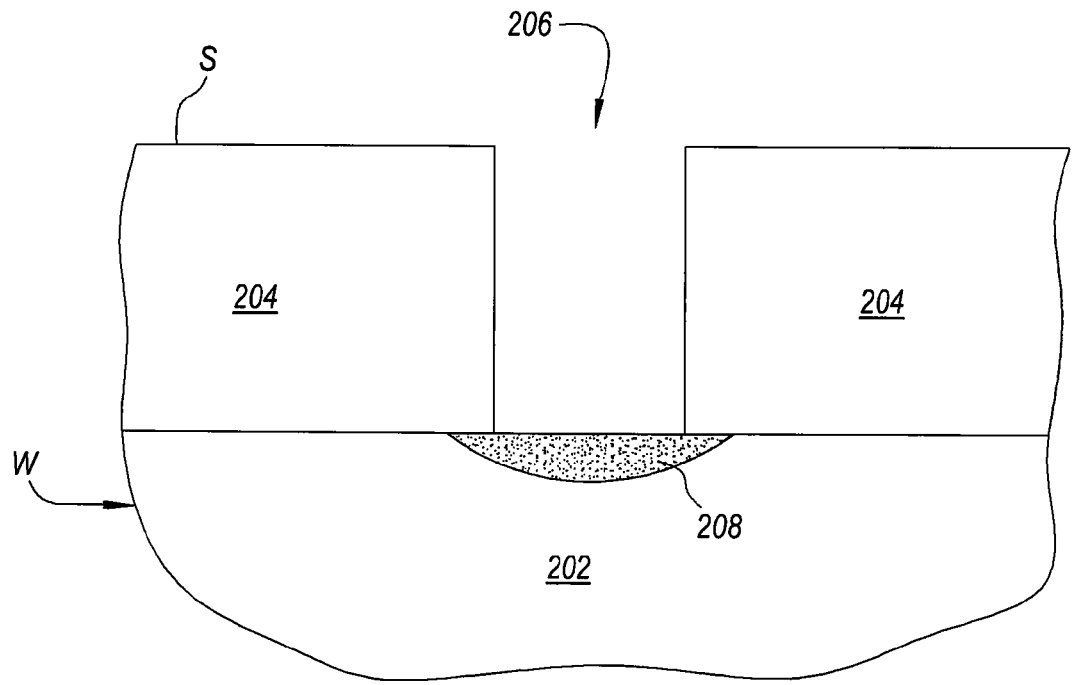
FIG. 6 schematically illustrates a first stage in the formation of a microelectronic capacitor in accordance with one embodiment of the invention.

FIGS. 6-11 schematically illustrate sequential stages in the manufacture of a microelectronic capacitor 200 in accordance with one embodiment of the invention. Turning first to FIG. 6, the workpiece W shown in this drawing includes a semiconductor substrate 202 having a heavily doped active area 208. An electrically insulating layer 204 is carried by the substrate 202 and has an opening 206 that extends from an exterior of the insulating layer 204 down to the active area 208 of the substrate 202. This provides the workpiece W with a three-dimensional outer surface S upon which materials will be deposited in subsequent steps. A workpiece W such as that shown in FIG. 6 may be made easily using conventional techniques known in the art.

Figure 7:
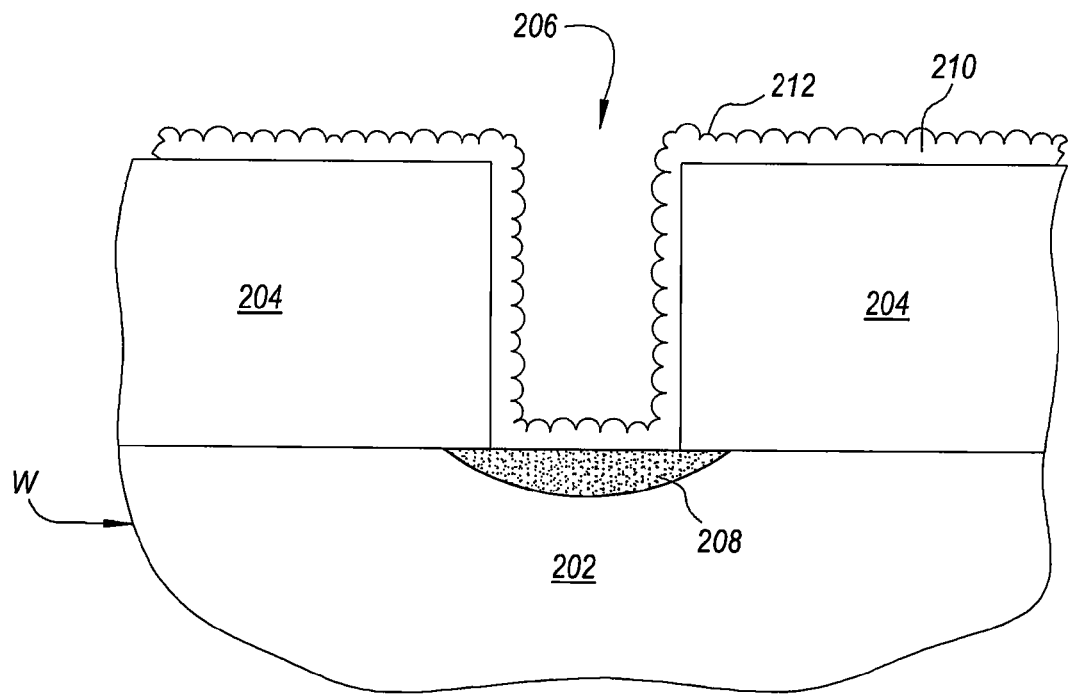
FIG. 7 schematically illustrates the structure of FIG. 5 and a subsequent stage of manufacture.

In FIG. 7, a hemispherical grain polysilicon layer 210 has been formed on the surface S of the workpiece W of FIG. 6. The HSG silicon layer 210 has a rough surface 212 that increases the surface area of the layer, as discussed above. As discussed below, this HSG silicon layer 210 may define a layer of a bottom electrode of the capacitor 200. If so desired, the HSG silicon layer 210 may be doped, e.g., with arsenic or phosphorous, to enhance its electrical conductivity. The HSG silicon layer 210 may be formed in any of a variety of commonly known methods. One such method includes vacuum annealing of an amorphous silicon layer or a polysilicon layer with relatively small grain size, inducing grain growth at nucleation sites. Another common method of forming HSG silicon includes direct deposition, wherein polysilicon selectively grows at nucleation sites during deposition.

Figure 8A:
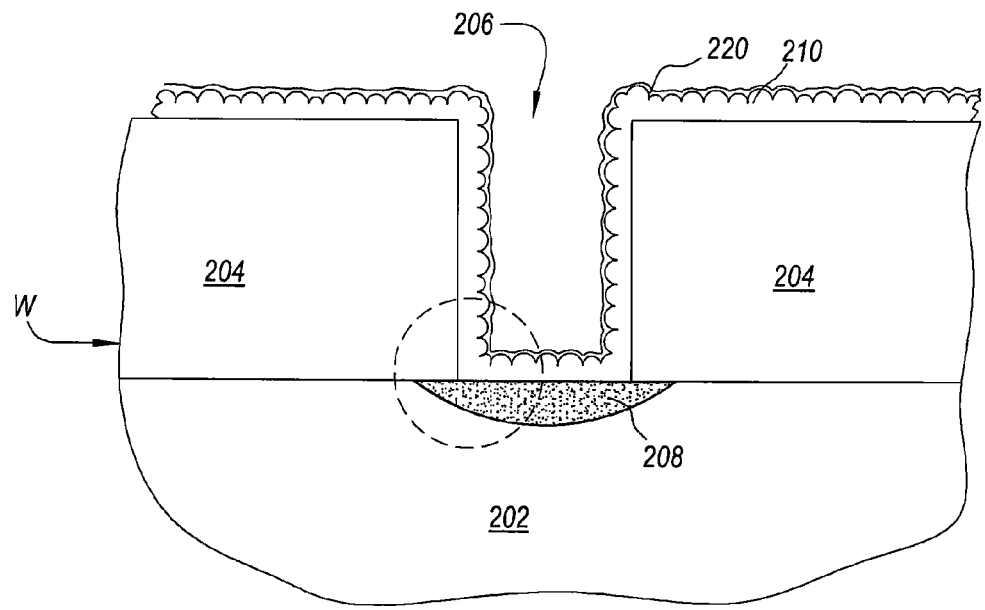
FIG. 8A is a schematic illustration of the structure of FIG. 6 after addition of a first electrically conductive layer.
Figure 8B:
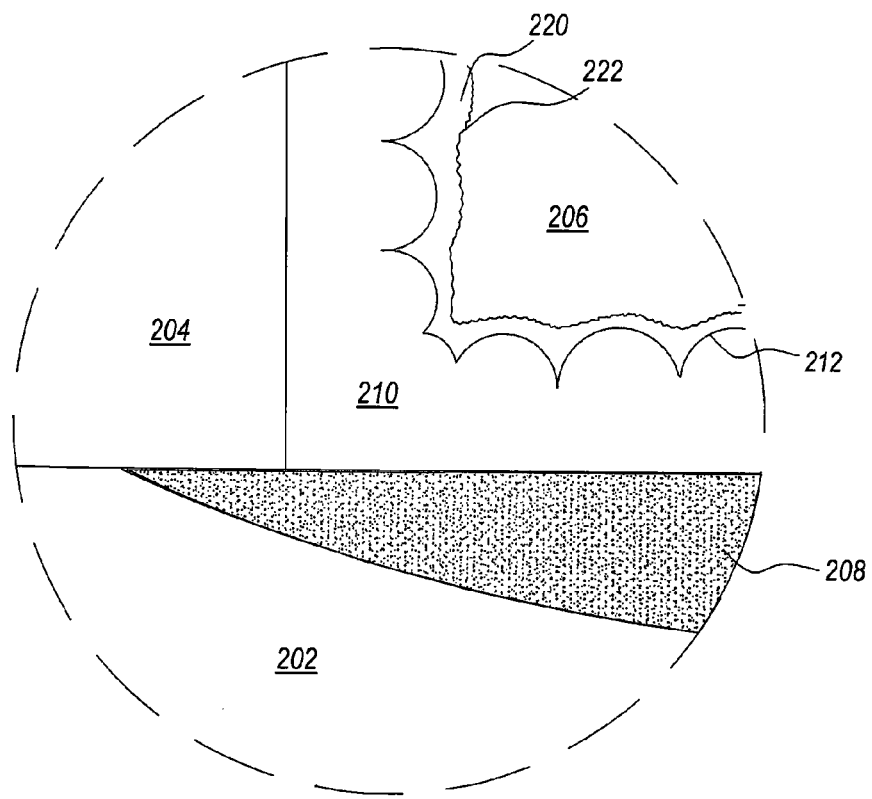
FIG. 8B is an enlarged close up view of the encircled area of FIG. 7A.

FIGS. 8A and 8B schematically illustrate the workpiece W of FIG. 7 after deposition of an electrically conductive CVD layer 220 on the rough surface 212 of the HSG silicon layer 210. The CVD layer 220 may be deposited in any of a variety of CVD processes that will yield an electrically conductive layer 220 that conforms reasonably well to the roughened surface 212 of the HSG polysilicon. In certain embodiments of the invention, the CVD layer 220 is deposited by introducing a first gaseous precursor and a second gaseous precursor to the process chamber 20 of the reactor 10 at the same time so these gases may react and be deposited directly on the surface 212 of the HSG layer 210. In one exemplary embodiment, the CVD layer 220 comprises a layer of titanium nitride formed by reaction of a titanium-containing first precursor and a nitrogen-containing second precursor. For example, a titanium nitride CVD layer 220 may be deposited by introducing titanium chloride $TiCl_4$ and $NH_3$ to the process chamber 20 under appropriate conditions, which are widely known. In another embodiment employing MOCVD, TDMAT is used as a metal organic precursor and nitrogen is used as a carrier gas. As suggested in FIG. 8B, the outer surface 222 of the CVD layer 220, i.e., the surface of the CVD layer 220 spaced away from the underlying HSG silicon layer 210, may exhibit microroughness, illustrated schematically in FIG. 8B as an irregular outer surface 222.

Figure 9A:
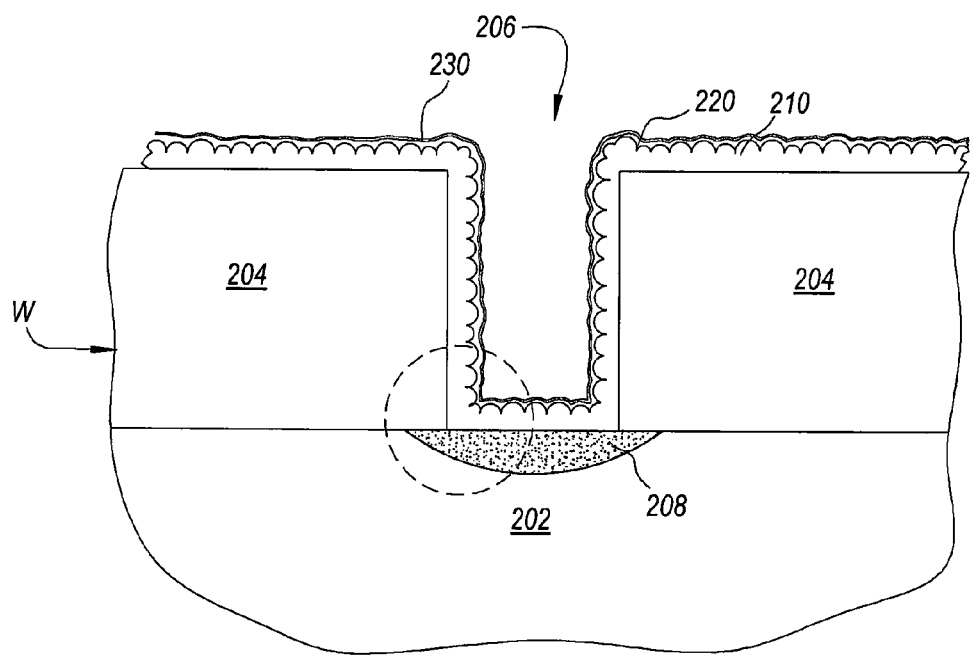
FIG. 9A is a schematic illustration of the device of FIG. 7A bearing another electrically conductive layer.
Figure 9B:
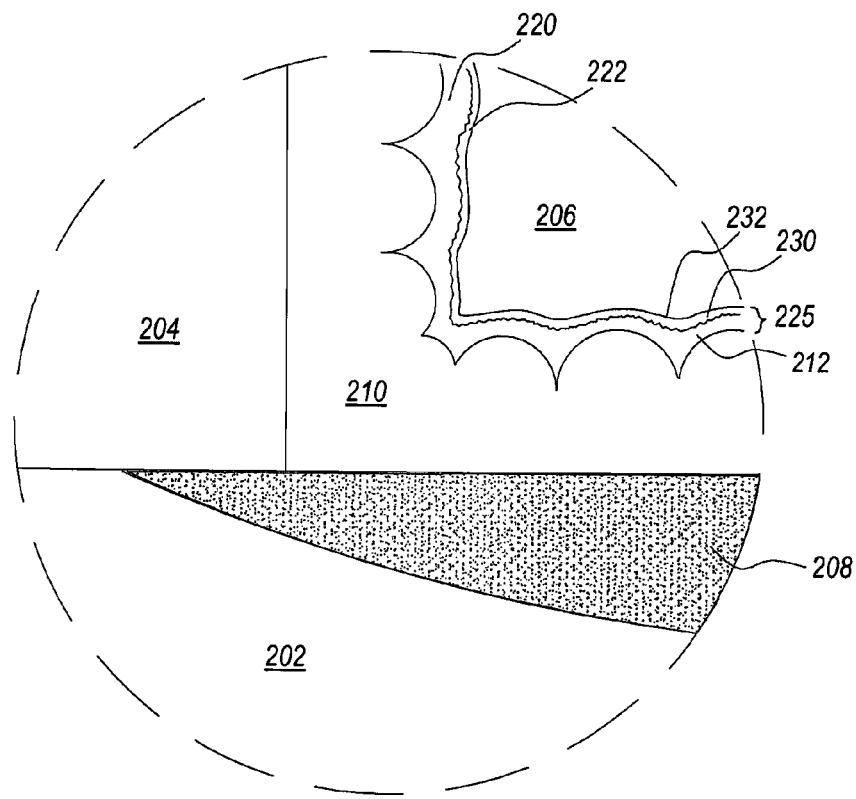
FIG. 9B is an enlarged isolation view of the encircled portion of FIG. 8A.
Figures 9C, 9D:
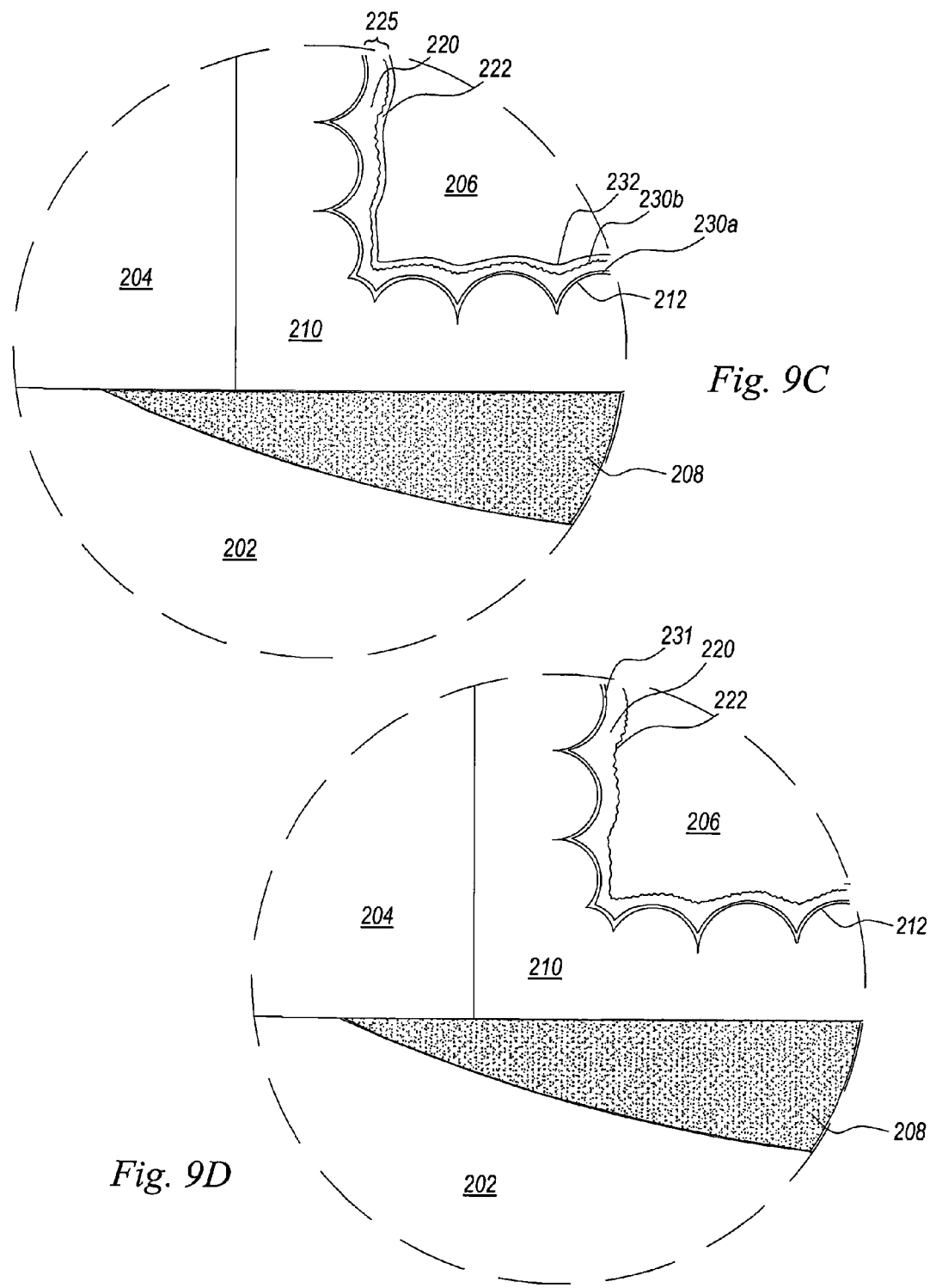
FIG. 9C is an enlarged isolation view, similar to FIG. 9B, of a portion of a device in accordance with another embodiment of the invention.
FIG. 9D is an enlarged isolation view, similar to FIG. 9B, of a portion of a device in accordance with an alternative embodiment of the invention.

As illustrated in FIGS. 9A and 9B, an ALD layer 230 may be deposited on the outer surface 222 of the CVD layer 220. This ALD layer may be formed using any suitable ALD technique, including, but not limited to, the ALD processes 110 and 120 shown in FIGS. 4 and 5, respectively. This ALD layer 230 will typically comprise at least two nanolayers, with each nanolayer being generated in a single cycle of the ALD process. Both the combined thickness of the CVD layer 220 and the ALD layer 230 and the relative thicknesses of these layers 220 and 230 may vary depending on the material used and the desired capacitance of the capacitor 200. In one embodiment, the combined thickness of the CVD layer 220 and the ALD layer 230, referred to collectively as an electrically conductive coating (225 in FIG. 9B), may be on the order of about 50-500 Å, e.g., about 150-250 Å. In certain embodiments of the invention, the ALD layer 230 has a thickness of no greater than 50 Å, with the balance of the electrically conductive coating 225 comprising the CVD layer 220.

The ALD layer 230 may be formed of an electrically conductive material having a primary species that is different from a primary species of the electrically conductive material of the CVD layer 220. In many embodiments of the present invention, though, the ALD layer 230 and the CVD layer 220 comprise the same primary species (e.g., TiN). As noted above, though, the CVD layer 220 likely will have a higher impurity content, (e.g., TiC or chlorine) than will the ALD layer 230. In one particular embodiment, the precursors used to deposit the CVD layer 220 are the same precursors used to deposit the ALD layer 230. In other embodiments wherein the CVD layer 220 and the ALD layer 230 generally comprise the same primary species, the CVD layer may be formed using one precursor or a pair of precursors and the ALD layer 230 may be formed using a different precursor or pair of precursors.

The electrically conductive coating 225 shown in FIGS. 9A-B comprises a single CVD layer 220 and a single ALD layer 230. In other embodiments, however, the electrically conductive coating 225 may comprise three or more layers. As suggested in FIG. 9C, for example, this electrically conductive coating 225 may comprise an initial ALD layer 230a deposited directly atop the roughened surface 212 of the HSG silicon, a CVD layer 220 may be deposited on that initial ALD layer 230a, and an outer ALD layer 230b may be deposited on the irregular surface 222 of the CVD layer 220. In another embodiment, illustrated in FIG. 9D, the electrically conductive coating comprises an ALD layer 231 deposited on the surface 212 of the HSG silicon and a CVD layer 220 on the ALD layer, with the dielectric layer (layer 240 in FIG. 10) deposited on the CVD layer 220. For reasons noted below, the dielectric layer in select embodiments of the invention is deposited on or is otherwise in direct contact with a layer deposited via ALD, e.g., ALD layer 230.

In another exemplary embodiment, the electrically conductive layer 225 atop the HSG silicon layer 210 comprises a first CVD-deposited layer, an ALD-deposited layer atop the first CVD-deposited layer, a second CVD-deposited layer atop the first ALD-deposited layer, and a second ALD-deposited layer deposited atop the second CVD-deposited layer. In other embodiments, the electrically conductive layer 225 comprises five or more layers, with the layers alternating between CVD-deposited layers and ALD-deposited layers. In still other embodiments, the HSG silicon layer 210 may be omitted and the electrically conductive layer 225 may be deposited directly on the surface S of the workpiece W shown in FIG. 6. In such an embodiment, the electrically conductive layer 225 will form the entirety of the bottom electrode of the capacitor 200 of FIG. 12. Such an electrically conductive layer may comprise three or more alternating ALD-deposited and CVD-deposited layers.

The outer surface 232 of the ALD layer 230, i.e., the surface that is spaced away from the irregular surface 222 of the CVD layer 220, may be relatively smooth. As suggested in FIGS. 9A-B, this surface 232 likely will not be perfectly flat. On a localized scale, though, the ALD layer will have a surface roughness that is less than the surface roughness of the irregular surface 222 of the CVD layer 220. This smooth surface 232 is anticipated to provide a more effective electrical contact between the electrically conductive coating and the subsequently-deposited dielectric layer 240, discussed below.

Figure 10:
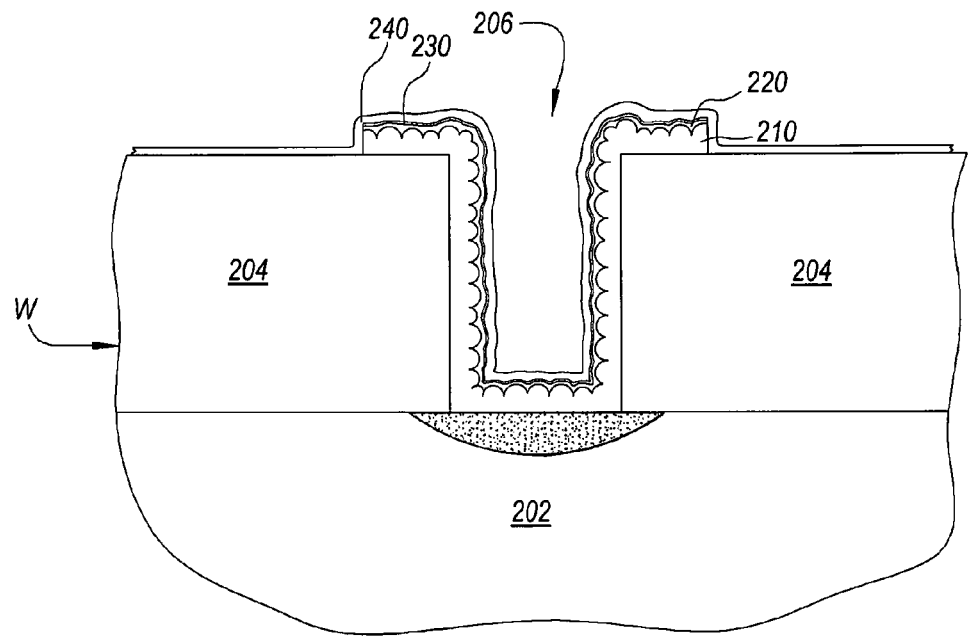
FIG. 10 is a schematic illustration of the device of FIG. 6A bearing a dielectric layer.

FIG. 10 schematically illustrates the workpiece W of FIG. 9A after deposition of a dielectric layer 240. The HSG silicon layer 210, the CVD layer 220, and the ALD layer 230 shown in FIG. 9A extend across much or all of the surface of the workpiece W. In one embodiment, the dielectric layer 240 is deposited on the structure and all four of the layers 210, 220, 230, and 240 may cover much if not all of the surface of the workpiece W. In the embodiment shown in FIG. 10, though, the layers illustrated in FIG. 9A have been patterned to remove excess material, leaving the surface of the opening 206 and, in one embodiment, a peripheral margin of the opening 206 covered. This may be accomplished using conventional photolithographic and selective etching techniques.

A wide variety of dielectric materials suitable for use as the dielectric layer 240 are well known in the art of microelectronic capacitors. As noted in the background section above, the capacitance of a capacitor can be increased by increasing the dielectric constant of the dielectric material and/or reducing the thickness of the dielectric material. Although conventional silica ($SiO_2$) or silicon nitride ($Si_3N_4$) may be employed, materials with higher dielectric constants—including, for example, alumina ($Al_2O_3$), tantala ($Ta_2O_5$), barium strontium titanate (BST), strontium titanate (ST), barium titanate (BT), lead zirconium titanate (PZT), and strontium bismuth titanate (SBT)—may yield a capacitor 200 with a higher capacitance. In one specific example, the dielectric layer 240 comprises alumina. The dielectric layer may be deposited in any desired fashion, including CVD, ALD, or sputtering.

Figure 11:
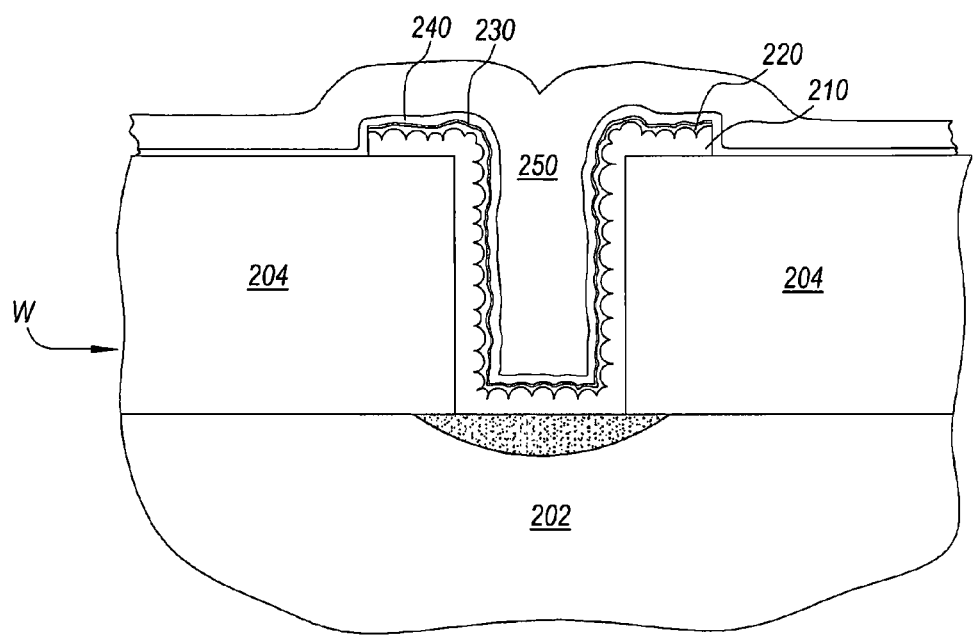
FIG. 11 is a schematic illustration of the device of FIG. 9 after addition of a second electrode layer.

FIG. 11 schematically illustrates the workpiece W of FIG. 10 after a second electrode 250 has been deposited on the dielectric layer 240. This second electrode 250 may be formed in any suitable manner. In one particular embodiment, the electrode 250 is formed via CVD. The material of the electrode 250 may be any electrically conductive material that is compatible with the dielectric layer 240 and the other components of the workpiece W. In one particular embodiment, the electrode 250 comprises the same primary species as the primary species of the CVD layer 220 and/or the ALD layer 230. For example, if the CVD layer 220 and the ALD layer 230 comprise TiN, the electrode 250 may also comprise TiN. In one particular embodiment, the electrode 250 is formed using the same precursors and the same basic deposition process as those used to deposit the CVD layer 220 and/or the ALD layer 230.

Figure 12:
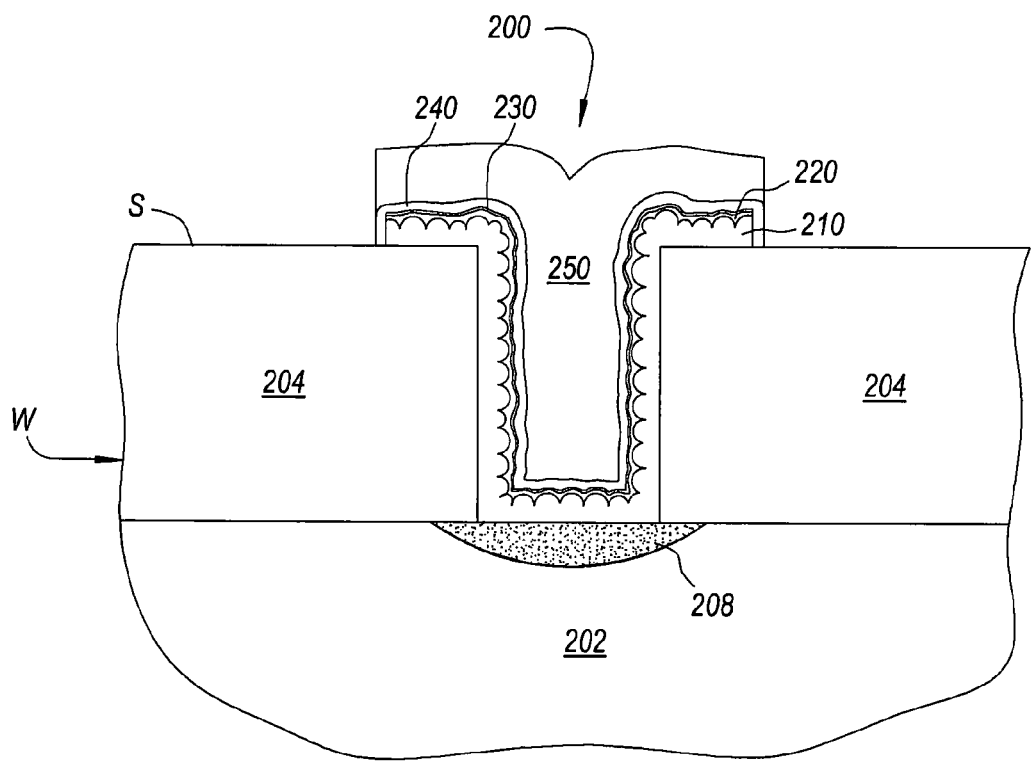
FIG. 12 is a schematic illustration of a microelectronic capacitor in accordance with one particular embodiment of the invention.

FIG. 12 illustrates the finished capacitor 200. In forming the finished capacitor 200, the surface of the workpiece W shown in FIG. 11 may be patterned using conventional photolithographic and etching techniques.

Figure 13:
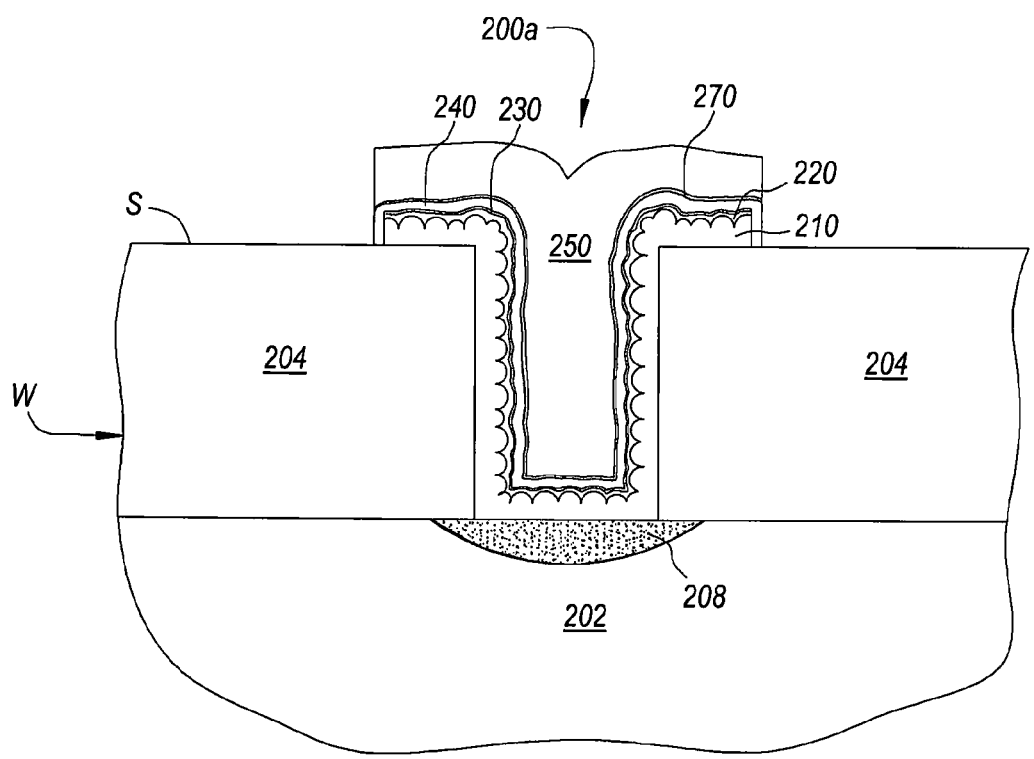
FIG. 13 is a schematic illustration of a microelectronic capacitor in accordance with another embodiment of the invention.

Methods in accordance with the present invention may be employed to create capacitors having a variety of different structures. For example, FIG. 13 illustrates a microelectronic capacitor 200a in accordance with an alternative embodiment of the invention. Many of the elements of FIG. 12 are shown in FIG. 13, and like reference numbers are used in FIGS. 12 and 13 to indicate like elements. One difference between the electrodes 200 and 200a is the interface between the electrode 250 and the dielectric layer 240. In the capacitor 200, the electrode 250 may comprise a bulk layer of material formed, e.g., by a continuous CVD process. The capacitor 200a of FIG. 13 instead employs a second ALD layer 270 on the outer surface of the dielectric layer 240, i.e., the surface of the dielectric layer 240 oriented away from the first ALD layer 230. This second ALD layer 270 may be deposited in much the same fashion as the first ALD layer 230. In select embodiments, the ALD layer 270 may have a thickness of no greater than about 50 Å. Because of the highly conformal nature of ALD coatings, the addition of such a second ALD layer 270 is expected to improve the electrical interface between the dielectric 240 and the outer electrode 250.

Figure 14:
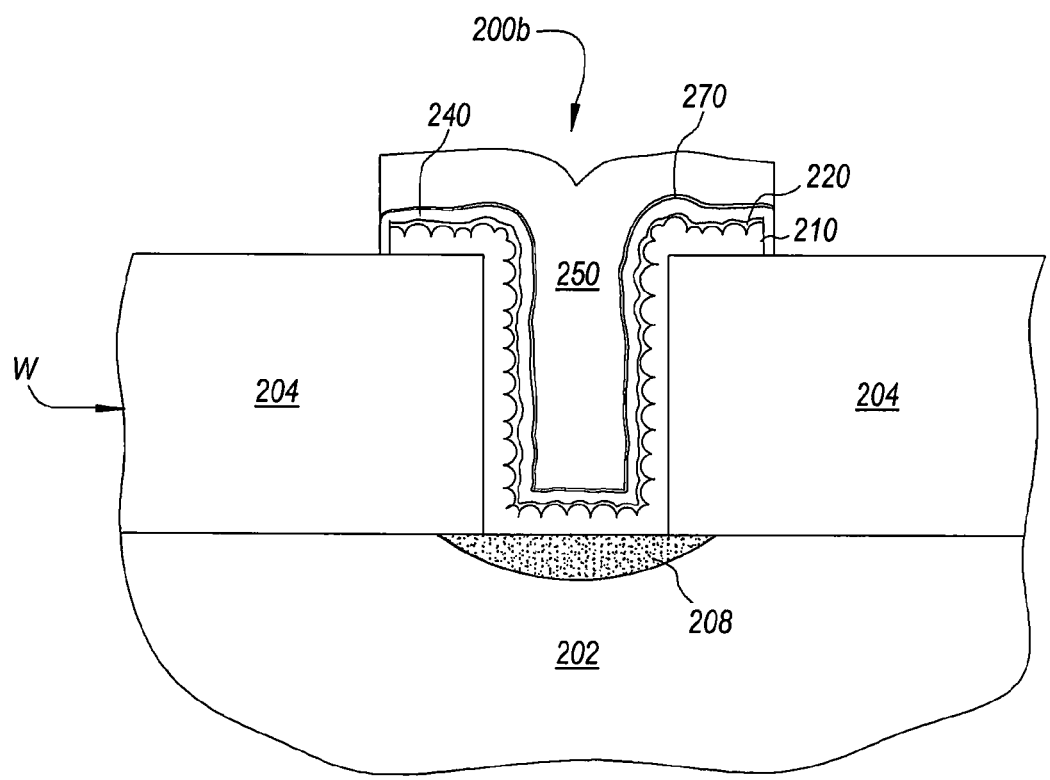
FIG. 14 is a schematic illustration of a microelectronic capacitor in accordance with still another embodiment of the invention.

FIG. 14 schematically illustrates a capacitor 200b in accordance with another embodiment of the invention. Like reference numbers are used in FIGS. 13 and 14 to indicate like elements. One difference between the capacitors 200a and 200b is that the capacitor 200b of FIG. 14 omits the first dielectric layer 230 employed in the capacitor 200a of FIG. 13. Instead, a single ALD layer 270 is disposed between the dielectric layer 240 and the rest of the top electrode 250.

Further variations of these embodiments are also envisioned. For example, the majority of the thickness of the electrode 250 in each of the illustrated embodiments comprises a single bulk layer. In other embodiments of the invention, the electrode 250 may be formed as an alternating series of ALD-deposited and CVD-deposited layers.

Unless the context clearly requires otherwise, throughout the description and the claims, the words "comprise," "comprising," and the like are to be construed in an inclusive sense as opposed to an exclusive or exhaustive sense, i.e., in a sense of "including, but not limited to." Words using the singular or plural number also include the plural or singular number, respectively. Use of the word "or" in the claims in reference to a list of items is intended to cover a) any of the items in the list, b) all of the items in the list, and c) any combination of the items in the list.

The above-detailed descriptions of embodiments of the invention are not intended to be exhaustive or to limit the invention to the precise form disclosed above. Specific embodiments of, and examples for, the invention are described above for illustrative purposes, but various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above-detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

The invention claimed is:

1. A microelectronic capacitor comprising:
a first electrode including, moving outwardly from a surface of a substrate, a hemispherical grain polycrystalline silicon layer, a layer of a bulk deposition product comprising a primary species, and a layer of a nanolayer deposition product comprising the same primary species, the layer of the nanolayer deposition product having a thickness of no greater than 50 Å and the bulk deposition product having an impurity content higher than an impurity content of the nanolayer deposition product;
a dielectric layer deposited on the nanolayer deposition product of the first electrode; and
a second electrode deposited on the dielectric layer.

2. The microelectronic capacitor of claim 1 wherein the layer of the bulk deposition product has a first interface surface oriented away from the substrate and the layer of the nanolayer deposition product has a second interface surface oriented away from the substrate and in contact with the dielectric layer, the first interface surface having a surface roughness greater than a surface roughness of the second interface surface.

3. The microelectronic capacitor of claim 1 wherein a combined thickness of the bulk deposition product and the nanolayer deposition product is about 150-250 Å.

4. The microelectronic capacitor of claim 1 wherein the hemispherical grain polycrystalline silicon layer has a first surface oriented away from the substrate and the layer of the nanolayer deposition product has a second surface oriented away from the substrate and in contact with the dielectric layer, the first surface having a surface roughness greater than a surface roughness of the second surface.

5. The microelectronic capacitor of claim 1 wherein the hemispherical grain polycrystalline silicon layer is doped with at least one of arsenic or phosphorous to enhance an electrical conductivity value of the hemispherical grain polycrystalline silicon layer.

6. The microelectronic capacitor of claim 1 wherein the bulk deposition product comprises a layer of titanium nitride formed by a reaction of a titanium containing first precursor and a nitrogen-containing second precursor.

7. The microelectronic capacitor of claim 1, further comprising a second layer of the bulk deposition product intermediate the layer of the nanolayer deposition product and the dielectric layer.

8. The microelectronic capacitor of claim 7, further comprising a second layer of the nanolayer deposition product intermediate the second layer of the bulk deposition product and the dielectric layer.

9. The microelectronic capacitor of claim 1 wherein the dielectric layer includes alumina.

10. The microelectronic capacitor of claim 1 wherein the second electrode includes a second layer of the bulk deposition product comprising the primary species, and a second layer of the nanolayer deposition product comprising the same primary species.

11. The microelectronic capacitor of claim 10 wherein the second layer of the nanolayer deposition product is deposited on the dielectric layer.

12. A microelectronic capacitor comprising:
first and second electrodes on a surface of a microfeature workpiece, at least one of the first and second electrodes having an electrically conductive coating, the electrically conductive coating including—
a first conductive layer deposited by chemical vapor deposition (CVD) of first and second gaseous precursor species, the first conductive layer having a first surface roughness and a first impurity content; and
a second conductive layer deposited by atomic layer deposition (ALD) of third and fourth gaseous precursor species, the second conductive layer having a second surface roughness that is smoother than the first surface roughness and a second impurity content that is lower than the first impurity content; and
a dielectric layer disposed between the first and second electrodes.

13. The microelectronic capacitor of claim 12, further comprising a hemispherical grain polycrystalline silicon layer on the surface of the microfeature workpiece, and wherein the electrically conductive coating is deposited onto the hemispherical grain polycrystalline silicon layer.

14. The microelectronic capacitor of claim 12 wherein moving outwardly from a surface of the microfeature workpiece, the second conductive layer is deposited on the first conductive layer.

15. The microelectronic capacitor of claim 12 wherein the third gaseous precursor is the same as the first gaseous precursor and the further gaseous precursor is the same as the second gaseous precursor.

16. The microelectronic capacitor of claim 12 wherein the electrically conductive coating has a thickness of about 50-500 Å.

17. The microelectronic capacitor of claim 12 wherein the electrically conductive coating has a thickness of about 150-250 Å.

18. The microelectronic capacitor of claim 12 wherein the second conductive layer has a thickness of no greater than about 50 Å.

19. The microelectronic capacitor of claim 12 wherein the electrically conductive coating further comprises a third conductive layer.

20. The microelectronic capacitor of claim 19 wherein the electrically conductive coating further comprises a fourth conductive layer, and wherein the third conductive layer is deposited by CVD of the first and second gaseous precursor species, and the fourth conductive layer is deposited by ALD of the third and fourth gaseous precursor species.

21. The microelectronic capacitor of claim 12 wherein the second conductive layer includes a first nanolayer comprising a first nanolayer deposition product formed by the third gaseous precursor, and a second nanolayer comprising a second nanolayer deposition product formed by the fourth gaseous precursor.

22. The microelectronic capacitor of claim 12 wherein moving outwardly from a surface of the microfeature workpiece, the first conductive layer is deposited on the second conductive layer.

* * * * *